(12) United States Patent
Kubena et al.

(10) Patent No.: US 8,766,745 B1
(45) Date of Patent: Jul. 1, 2014

(54) QUARTZ-BASED DISK RESONATOR GYRO WITH ULTRA-THIN CONDUCTIVE OUTER ELECTRODES AND METHOD OF MAKING SAME

(75) Inventors: Randall L. Kubena, Oak Park, CA (US); David T. Chang, Calabasas, CA (US); Robert L. Larson, West Seattle, WA (US)

(73) Assignees: HRL Laboratories, LLC, Malibu, CA (US); The Boeing Company, Chicago, IL (US)

( * ) Notice: Subject to any disclaimer, the term of this patent is extended or adjusted under 35 U.S.C. 154(b) by 873 days.

(21) Appl. No.: 12/488,784

(22) Filed: Jun. 22, 2009

Related U.S. Application Data

(63) Continuation-in-part of application No. 12/179,579, filed on Jul. 24, 2008, now abandoned.

(60) Provisional application No. 61/082,125, filed on Jul. 18, 2008, provisional application No. 60/962,176, filed on Jul. 25, 2007, provisional application No. 60/973,703, filed on Sep. 19, 2007.

(51) Int. Cl.
*H03H 9/02* (2006.01)
*G01C 19/00* (2013.01)
*H03H 9/24* (2006.01)

(52) U.S. Cl.
USPC .......................... 333/186; 333/197; 73/503.3

(58) Field of Classification Search
USPC ............ 333/186, 197, 199; 73/503.3, 504.04, 73/504.12
See application file for complete search history.

(56) References Cited

U.S. PATENT DOCUMENTS

| | | | |
|---|---|---|---|
| 392,650 A | 11/1888 | Watrous | |
| 2,487,165 A | 11/1949 | Miller | |
| 3,390,287 A | 6/1968 | Sonderegger | |
| 3,766,616 A | 10/1973 | Staudte | 29/25.35 |
| 4,364,016 A | 12/1982 | Tanski | 333/193 |
| 4,426,769 A | 1/1984 | Grabbe | |
| 4,442,574 A | 4/1984 | Wanuga et al. | 29/25.35 |
| 4,618,262 A | 10/1986 | Maydan et al. | |
| 4,870,313 A | 9/1989 | Hirama et al. | |
| 4,898,031 A | 2/1990 | Oikawa et al. | |

(Continued)

FOREIGN PATENT DOCUMENTS

| | | |
|---|---|---|
| DE | 44 42 033 | 5/1996 |
| DE | 19719601 | 11/1998 |

(Continued)

OTHER PUBLICATIONS

Barbour et al., "Micromechanical Silicon Instrument and Systems Development at Draper Laboratory," AIAA Guidance Navigation and Control Conference, 1996, Paper No. 96-3709.

(Continued)

*Primary Examiner* — Dean O Takaoka
*Assistant Examiner* — Alan Wong
(74) *Attorney, Agent, or Firm* — Ladas & Parry

(57) ABSTRACT

A disk resonator gyroscope includes a quartz base, a quartz resonator disk having a central pillar connected to the base, the quartz resonator disk having a surface facing the base and having plurality of circumferential slots in the surface of the quartz resonator disk around the central pillar, and an electrode comprised of quartz and connected to the base outside of an outer edge of the resonator disk.

28 Claims, 29 Drawing Sheets

(56) References Cited

U.S. PATENT DOCUMENTS

| | | | |
|---|---|---|---|
| 4,944,836 A | 7/1990 | Beyer et al. | |
| 5,203,208 A | 4/1993 | Bernstein | |
| 5,226,321 A | 7/1993 | Varnham et al. | |
| 5,260,596 A | 11/1993 | Dunn et al. | 257/414 |
| 5,421,312 A | 6/1995 | Dawson | |
| 5,480,747 A | 1/1996 | Vasudev | |
| 5,530,408 A | 6/1996 | Vig et al. | |
| 5,552,016 A | 9/1996 | Ghanayem | |
| 5,578,976 A | 11/1996 | Yao | |
| 5,589,724 A | 12/1996 | Satoh et al. | |
| 5,604,312 A | 2/1997 | Lutz | |
| 5,605,490 A | 2/1997 | Laffey et al. | 216/52 |
| 5,644,139 A | 7/1997 | Allen | |
| 5,646,346 A | 7/1997 | Okada | |
| 5,648,849 A | 7/1997 | Canteloup et al. | |
| 5,658,418 A | 8/1997 | Coronel et al. | |
| 5,665,915 A | 9/1997 | Kobayashi et al. | |
| 5,666,706 A | 9/1997 | Tomita et al. | 29/25.35 |
| 5,668,057 A | 9/1997 | Eda et al. | |
| 5,728,936 A | 3/1998 | Lutz | |
| 5,783,749 A | 7/1998 | Lee et al. | |
| 5,894,090 A | 4/1999 | Tang et al. | |
| 5,905,202 A | 5/1999 | Kubena et al. | |
| 5,920,012 A | 7/1999 | Pinson | |
| 5,928,532 A | 7/1999 | Koshimizu et al. | |
| 5,942,445 A | 8/1999 | Kato et al. | |
| 5,959,206 A | 9/1999 | Ryrko et al. | |
| 5,981,392 A | 11/1999 | Oishi | |
| 5,987,985 A | 11/1999 | Okada | |
| 6,009,751 A | 1/2000 | Ljung | |
| 6,044,705 A | 4/2000 | Neukermans et al. | |
| 6,049,702 A | 4/2000 | Tham et al. | |
| 6,081,334 A | 6/2000 | Grimbergen et al. | |
| 6,089,088 A * | 7/2000 | Charvet | 73/504.12 |
| 6,094,985 A | 8/2000 | Kapels et al. | |
| 6,114,801 A | 9/2000 | Tanaka et al. | 310/365 |
| 6,145,380 A | 11/2000 | MacGugan | |
| 6,151,964 A | 11/2000 | Nakajima | |
| 6,155,115 A | 12/2000 | Ljung | |
| 6,164,134 A | 12/2000 | Cargille | |
| 6,182,352 B1 | 2/2001 | Deschenes et al. | |
| 6,196,059 B1 | 3/2001 | Kosslinger | |
| 6,204,737 B1 | 3/2001 | Ella | |
| 6,207,008 B1 | 3/2001 | Kijima | |
| 6,236,145 B1 | 5/2001 | Biernacki | |
| 6,250,157 B1 | 6/2001 | Touge | |
| 6,263,552 B1 | 7/2001 | Takeuchi et al. | |
| 6,282,958 B1 | 9/2001 | Fell et al. | |
| 6,289,733 B1 | 9/2001 | Challoner et al. | |
| 6,297,064 B1 | 10/2001 | Koshimizu | |
| 6,349,597 B1 | 2/2002 | Folkmer et al. | |
| 6,367,326 B1 | 4/2002 | Okada | |
| 6,367,786 B1 | 4/2002 | Gutierrez et al. | |
| 6,413,682 B1 | 7/2002 | Shibano et al. | |
| 6,417,925 B1 | 7/2002 | Naya | |
| 6,424,418 B2 | 7/2002 | Kawabata et al. | |
| 6,426,296 B1 | 7/2002 | Okojie | |
| 6,432,824 B2 | 8/2002 | Yanagisawa | |
| 6,481,284 B2 | 11/2002 | Geen et al. | |
| 6,481,285 B1 | 11/2002 | Shkel et al. | |
| 6,492,195 B2 | 12/2002 | Nakanishi | |
| 6,513,380 B2 | 2/2003 | Reeds, III et al. | |
| 6,514,767 B1 | 2/2003 | Natan | |
| 6,515,278 B2 | 2/2003 | Wine et al. | |
| 6,571,629 B1 | 6/2003 | Kipp et al. | |
| 6,584,845 B1 | 7/2003 | Gutierrez et al. | |
| 6,614,529 B1 | 9/2003 | Tang | |
| 6,621,158 B2 | 9/2003 | Martin et al. | |
| 6,627,067 B1 | 9/2003 | Branton et al. | |
| 6,628,177 B2 | 9/2003 | Clark et al. | |
| 6,629,460 B2 | 10/2003 | Challoner | |
| 6,651,027 B2 | 11/2003 | McCall | |
| 6,686,807 B1 * | 2/2004 | Giousouf et al. | 331/154 |
| 6,710,681 B2 | 3/2004 | Figueredo et al. | |
| 6,715,352 B2 | 4/2004 | Tracy | |
| 6,744,335 B2 | 6/2004 | Ryhanen | |
| 6,750,728 B2 | 6/2004 | Takahashi et al. | 331/156 |
| 6,756,304 B1 | 6/2004 | Robert | |
| 6,768,396 B2 | 7/2004 | Klee et al. | |
| 6,796,179 B2 | 9/2004 | Shcheglov et al. | |
| 6,806,557 B2 | 10/2004 | Ding | |
| 6,815,228 B2 | 11/2004 | Usui et al. | |
| 6,856,217 B1 | 2/2005 | Clark et al. | |
| 6,862,398 B2 | 3/2005 | Elkind et al. | |
| 6,883,374 B2 | 4/2005 | Fell et al. | |
| 6,915,215 B2 | 7/2005 | M'Closkey et al. | 702/32 |
| 6,933,164 B2 | 8/2005 | Kubena | |
| 6,943,484 B2 | 9/2005 | Clark et al. | |
| 6,985,051 B2 | 1/2006 | Nguyen et al. | |
| 7,057,331 B2 | 6/2006 | Shimodaira et al. | |
| 7,118,657 B2 | 10/2006 | Golovchenko et al. | |
| 7,152,290 B2 | 12/2006 | Junhua et al. | |
| 7,168,318 B2 * | 1/2007 | Challoner et al. | 73/504.13 |
| 7,211,933 B2 | 5/2007 | Kawakubo | |
| 7,224,245 B2 | 5/2007 | Song et al. | |
| 7,232,700 B1 | 6/2007 | Kubena | |
| 7,234,214 B2 | 6/2007 | Xu | |
| 7,237,315 B2 | 7/2007 | Kubena et al. | 29/594 |
| 7,295,088 B2 * | 11/2007 | Nguyen et al. | 333/186 |
| 7,317,354 B2 | 1/2008 | Lee | |
| 7,446,628 B2 | 11/2008 | Morris, III | |
| 7,459,099 B2 | 12/2008 | Kubena et al. | |
| 7,459,992 B2 | 12/2008 | Matsuda et al. | |
| 7,479,846 B2 | 1/2009 | Inoue et al. | |
| 7,490,390 B2 | 2/2009 | Kawakubo et al. | |
| 7,543,496 B2 | 6/2009 | Ayazi | |
| 7,551,054 B2 | 6/2009 | Mizuno et al. | |
| 7,555,824 B2 | 7/2009 | Chang | |
| 7,557,493 B2 | 7/2009 | Fujimoto | |
| 7,559,130 B2 | 7/2009 | Kubena et al. | |
| 7,564,177 B2 | 7/2009 | Yoshimatsu et al. | |
| 7,579,748 B2 | 8/2009 | Kuroda | |
| 7,579,926 B2 | 8/2009 | Jhung | |
| 7,581,443 B2 * | 9/2009 | Kubena et al. | 73/504.12 |
| 7,663,196 B2 | 2/2010 | Liu et al. | |
| 7,671,427 B2 | 3/2010 | Kim et al. | |
| 7,675,224 B2 | 3/2010 | Tanaya | |
| 7,750,535 B2 | 7/2010 | Kubena | |
| 7,757,393 B2 | 7/2010 | Ayazi et al. | |
| 7,791,431 B2 | 9/2010 | Han et al. | |
| 7,802,356 B1 | 9/2010 | Chang | |
| 7,830,074 B2 | 11/2010 | Kubena | |
| 7,872,548 B2 | 1/2011 | Nishihara et al. | |
| 7,884,930 B2 | 2/2011 | Kirby | |
| 7,895,892 B2 | 3/2011 | Aigner | |
| 7,994,877 B1 | 8/2011 | Kubena | |
| 8,138,016 B2 | 3/2012 | Chang | |
| 8,151,640 B1 | 4/2012 | Kubena | |
| 8,176,607 B1 | 5/2012 | Kubena | |
| 8,522,612 B1 | 9/2013 | Kubena | |
| 2002/0066317 A1 | 6/2002 | Lin | |
| 2002/0072246 A1 | 6/2002 | Goo et al. | |
| 2002/0074947 A1 | 6/2002 | Tsukamoto | |
| 2002/0107658 A1 | 8/2002 | McCall | |
| 2002/0185611 A1 | 12/2002 | Menapace et al. | |
| 2003/0003608 A1 | 1/2003 | Arikado et al. | |
| 2003/0010123 A1 | 1/2003 | Malvern et al. | |
| 2003/0029238 A1 | 2/2003 | Challoner | |
| 2003/0196490 A1 | 10/2003 | Cardarelli | |
| 2003/0205948 A1 | 11/2003 | Lin et al. | |
| 2004/0055380 A1 | 3/2004 | Shcheglov et al. | |
| 2004/0065864 A1 | 4/2004 | Vogt et al. | |
| 2004/0189311 A1 | 9/2004 | Glezer | |
| 2004/0211052 A1 | 10/2004 | Kubena | |
| 2005/0034822 A1 | 2/2005 | Kim et al. | |
| 2005/0062368 A1 | 3/2005 | Hirasawa | |
| 2005/0093659 A1 | 5/2005 | Larson et al. | |
| 2005/0156309 A1 | 7/2005 | Fujii | |
| 2005/0260792 A1 | 11/2005 | Patel | |
| 2006/0016065 A1 | 1/2006 | Nagaura | |
| 2006/0022556 A1 | 2/2006 | Bail et al. | |
| 2006/0055479 A1 | 3/2006 | Okazaki et al. | |
| 2006/0066419 A1 | 3/2006 | Iwaki et al. | |
| 2006/0197619 A1 | 9/2006 | Oishi et al. | |

(56) References Cited

U.S. PATENT DOCUMENTS

| | | |
|---|---|---|
| 2006/0213266 A1 | 9/2006 | French |
| 2006/0252906 A1 | 11/2006 | Godschalx et al. |
| 2007/0017287 A1 | 1/2007 | Kubena |
| 2007/0034005 A1 | 2/2007 | Acar et al. |
| 2007/0205839 A1 | 9/2007 | Kubena et al. |
| 2007/0220971 A1 | 9/2007 | Ayazi |
| 2007/0240508 A1 | 10/2007 | Watson |
| 2008/0034575 A1 | 2/2008 | Chang et al. |
| 2008/0074661 A1 | 3/2008 | Zhang et al. |
| 2008/0096313 A1 | 4/2008 | Patel |
| 2008/0148846 A1 | 6/2008 | Whelan |
| 2009/0146527 A1 | 6/2009 | Lee et al. |
| 2009/0189294 A1 | 7/2009 | Chang |
| 2010/0020311 A1 | 1/2010 | Kirby |
| 2010/0148803 A1 | 6/2010 | Ohnishi et al. |
| 2011/0107838 A1 | 5/2011 | Suijlen et al. |
| 2012/0000288 A1 | 1/2012 | Matsuura et al. |
| 2012/0212109 A1 | 8/2012 | Yamazaki et al. |
| 2012/0266682 A1 | 10/2012 | Torashima et al. |

FOREIGN PATENT DOCUMENTS

| | | |
|---|---|---|
| EP | 0 461 761 | 12/1991 |
| EP | 0 531 985 | 3/1993 |
| EP | 1055908 | 11/2000 |
| EP | 0 971 208 | 12/2000 |
| JP | 57-091017 | 6/1982 |
| JP | 401129517 | 5/1989 |
| JP | 04322507 | 11/1992 |
| JP | 5286142 | 11/1993 |
| JP | 06232678 | 8/1994 |
| JP | 6-318533 | 11/1994 |
| JP | 08330878 | 12/1996 |
| JP | 9-247025 | 9/1997 |
| JP | 2003-318685 A | 11/2003 |
| JP | 2005-180921 | 7/2005 |
| JP | 2006-352487 | 12/2006 |
| KR | 10-2001-0110428 | 12/2001 |
| WO | 84-00082 | 1/1984 |
| WO | WO 96/38710 | 12/1996 |
| WO | WO 98/15799 | 4/1998 |
| WO | WO 00/68640 | 11/2000 |
| WO | WO 01/44823 | 6/2001 |
| WO | WO 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

Burdess et al., "The Theory of a Piezoelectric Disc Gyroscope", Jul. 1986, IEEE vol. AES 22, No. 4; p. 410-418.

Fujita et al., "Disk-shaped bulk micromachined gyroscope with vacuum sealing," Sensors and Actuators A:Physical, vol. 82, May 2000, pp. 198-204.

Johnson et al., "Surface Micromachined Angular Rate Sensor," A1995 SAE Conference, Paper No. 950538, pp. 77-83.

Putty et al., "A Micromachined Vibrating Ring Gyroscope," Solid State Sensor and Actuator Workshop, Transducer Research Foundation, Hilton Head, 1994, pp. 213-220.

Sirbuly, Donald J. et al., Multifunctional Nanowire Evanescent Wave Optical Sensors, Advanced Materials, 2007 (published online: Dec. 5, 2006), 19, pp. 61-66.

Skulski et al., "Planar resonator sensor for moisture measurements", Microwaves and Radar, 1998, MIKON '98, 12th International Conf., vol. 3, May 20-22, 1998, pp. 692-695.

Tang et al., "A Packaged Silicon MEMS Vibratory Gyroscope for Microspacecraft," Proceedings IEEE, 10th Annual Int. Workshop on MEMS, Japan, 1997, pp. 500-505.

Tang et al., "Silicon Bulk Micromachined Vibratory Gyroscope," Jet Propulsion Lab, Jun. 2, 1996.

White, Lan M., et al., Increasing the Enhancement of SERS with Dielectric Microsphere Resonators, Spectroscopy-Eugene, Apr. 2006.

Wright et al., "The HRG Applied to a Satellite Attitude Reference System," Guidance and Control, AASAAS, 1994, 86: pp. 55-67 (13 pages).

Yan, Fei, et al., "Surface-enhanced Raman scattering (SERS) detection for chemical and biological agents," IEEE Sensors Journal, vol. 5, No. 4, Aug. 2005.

Abe,T., et al., "One-Chip Multichannel Quartz crystal microbalance (QCM) Fabricated by Deep RIE," Sensors and Actuators, 2000, pp. 139-143.

Aaltonen, T., et al., "ALD of Rhodium thin films from Rh(acac)3 and Oxygen," Electrochemical and Solid-State Lett. 8, C99 (2005).

Cleland, A.N., et al., "Fabrication of High Frequency Nanometer Scale Mechanical Resonators From Bulk Si Crystals, "applied Physics Letters, Oct. 28, 1996.

Evoy, S., et al., "Temperature-dependent Internal Friction in Silicon Nanoelectromechanical Systems," Applied Physics Letters, vol. 77, No. 15.

Greer, J.A., et al., "Properties of SAW resonators fabricated on quartz substrates of various qualities," Ultrasonics Symposium, 1994 IEEE, vol. 1, Nov. 1-4, 1994, pp. 31-36.

Lin, J.W, et al., "A Robust High-Q Micromachined RF Inductor for RFIC Applications," IEEE Transactions on Electronic Devices, vol. 52, No. 7, pp. 1489-1496 (Jul. 2005).

Park, K.J., et al., "Selective area atomic layer deposition of rhodium and effective work function characterization in capacitor structures," Applied Physics Letters 89, 043111 (2006).

U.S. Appl. No. 12/026,486 "MEMS On-Chip Inertial Navigation System With Error Correction," Randall L. Kubena, et al., Application and Office Actions.

U.S. Appl. No. 12/179,579 "ALD Metal Coatings for High Q MEMS Resonators," Randall L. Kubena, et al., Application and Office Actions.

U.S. Appl. No. 12/820,761 "Quartz Resonator with Low Stress Mounting," David T. Chang, et al., Application and Office Actions.

U.S. Appl. No. 12/831,028 "Ultra-Thin Quartz Resonator and Method of Fabrication," David T. Chang, et al., Application and Office Actions.

U.S. Appl. No. 13/163,357 "MEMS-based Quartz Hybrid Filters and a method of making the same," Randall L. Kubena, et al., Application and Office Actions.

U.S. Appl. No. 13/410,998 "MEMS On-Chip Inertial Navigation System With Error Correction," Randall L. Kubena, et al., Application and Office Actions.

U.S. Appl. No. 13/434,144 "A Resonator With a Fluid Cavity Therein," Randall L. Kubena, et al., Application and Office Actions.

U.S. Appl. No. 13/648,041 "Quartz-Based Disk Resonator Gyro With Ultra-Thin Conductive Outer Electrodes and Method of Making Same", Kubena et. al., Application & Office Actions flied Oct. 9, 2012.

From U.S. Appl. No. 10/426,931 (now U.S. Patent No. 7,237,315), Application and Office Actions including but not limited to the Office Actions dated Jun. 16, 2004, Aug. 31, 2004, Dec. 8, 2004, May 16, 2005, Aug. 11, 2005, Jan. 20, 2006, Jul. 11, 2006, Sep. 13, 2006, Oct. 24, 2006, and Feb. 1, 2007.

From U.S. Appl. No. 11/043,378 (now U.S. Patent No. 7,459,099), Application and Office Actions, including but not limited to the Office Actions dated Aug. 11, 2006, Dec. 6, 2006, May 25, 2007, Sep. 12, 2007, Jan. 15, 2008, and Aug. 4, 2008.

From U.S. Appl. No. 11/458,911 (now U.S. Patent No. 7,581,443), Application and Office Actions, including but not limited to the Office Actions dated Oct. 12, 2007, Apr. 17, 2008, Jul. 2, 2008, Sep. 17, 2008, and Apr. 23, 2009.

From U.S. Appl. No. 11/502,336 (now U.S. Patent No. 7,555,824), Application and Office Actions, including but not limited to the Office Actions dated Nov. 14, 2008, Jan. 23, 2009, and Mar. 20, 2009.

From U.S. Appl. No. 11/800,289 (now U.S. Patent No. 7,559,130), Application and Office Actions including but not limited to the Office Actions dated Oct. 24, 2008 and Mar. 25, 2009.

(56) References Cited

OTHER PUBLICATIONS

From U.S. Appl. No. 11/800,294 (now U.S. Patent No. 7,750,535), Application and Office Actions, including but not limited to the Office Actions dated Jul. 29, 2009 and Nov. 30, 2009.

From U.S. Appl. No. 11/818,797, Application and Office Actions, application filed Jun. 14, 2007.

From U.S. Appl. No. 11/881,461 (now U.S. Patent No. 7,830,074), Application and Office Actions, including but not limited to the Office Actions dated Jun. 16, 2009, Oct. 19, 2009, Jun. 2, 2010, Jul. 13, 2010, and Sep. 24, 2010.

From U.S. Appl. No. 12/026,486, Application and Office Actions, application filed Feb. 5, 2008.

From U.S. Appl. No. 12/027,247 (now U.S. Patent No. 8,151,640), Application and Office Actions, including but not limited to the Office Actions dated Feb. 16, 2011, Jun. 7, 20011, and Dec. 8, 2011.

From U.S. Appl. No. 12/034,852 (now U.S. Patent No. 7,802,356), Application and Office Actions, including but not limited to the Office Actions dated Oct. 2, 2009, Jan. 28, 2010, and May 19, 2010.

From U.S. Appl. No. 12/145,678 (now U.S. Patent No. 7,884,930), Application and Office Actions, including but not limited to the Office Actions dated including those dated Jul. 22, 2009, Jan. 14, 2010, Mar. 26, 2010, and Jul. 13, 2010.

From U.S. Appl. No. 12/268,309 (now U.S. Patent No. 7,994,877), Application and Office Actions, including but not limited to the Office Actions dated Aug. 20, 2010, Nov. 22, 2010, and Apr. 4, 2011.

From U.S. Appl. No. 12/399,680 (now U.S. Patent No. 8,138,016), Application and Office Actions, including but not limited to the Office Action mailed on Jun. 7, 2011, Aug. 4, 2011, and Nov. 14, 2011.

From U.S. Appl. No. 12/575,634 (now U.S. Patent No. 8,176,607), Application and Office Actions, including but not limited to Office Actions dated Mar. 23, 2011, Jul. 11, 2011, Oct. 17, 2011, and Jan. 9, 2012.

From U.S. Appl. No. 13/410,998 (now U.S. Patent No. 8,522,612), Application and Office Actions, including but not limited to the Office Action dated Apr. 11, 2013.

From U.S. Appl. No. 13/434,144, Application and Office Actions, including but not limited to the Office Action dated Jul. 11, 2013.

J.-M. Friedt and É. Carry, "*Introduction to the quartz tuning fork*", American Journal of Physics 75, 415 (2007), pp. 415-422.

\* cited by examiner

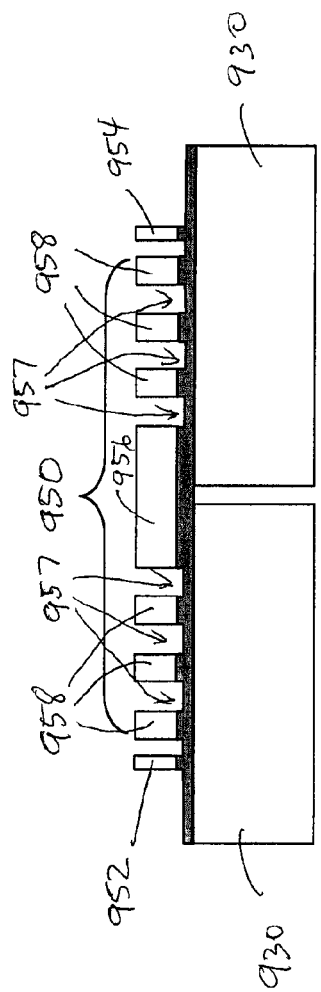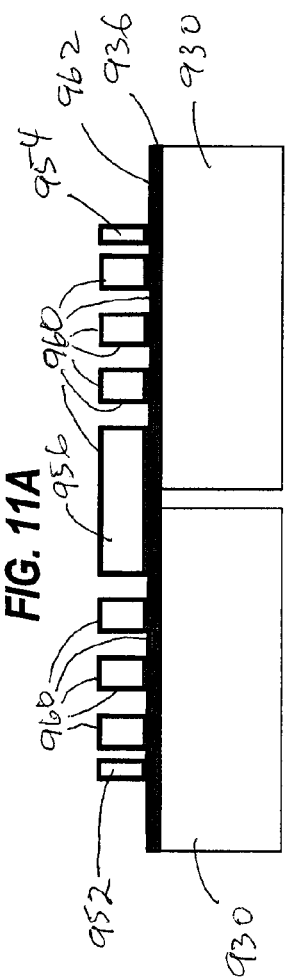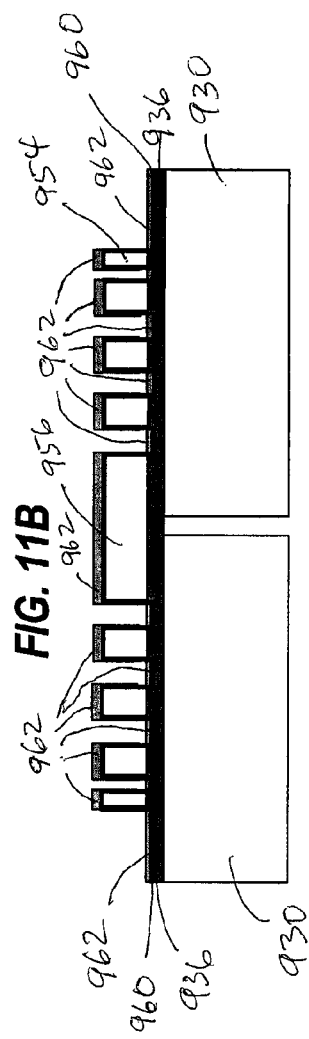
FIG. 11A
FIG. 11B
FIG. 11C

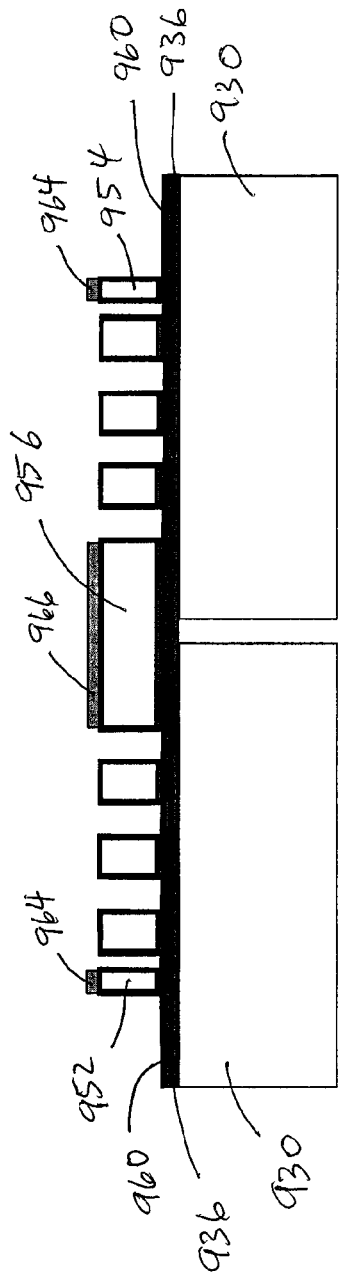
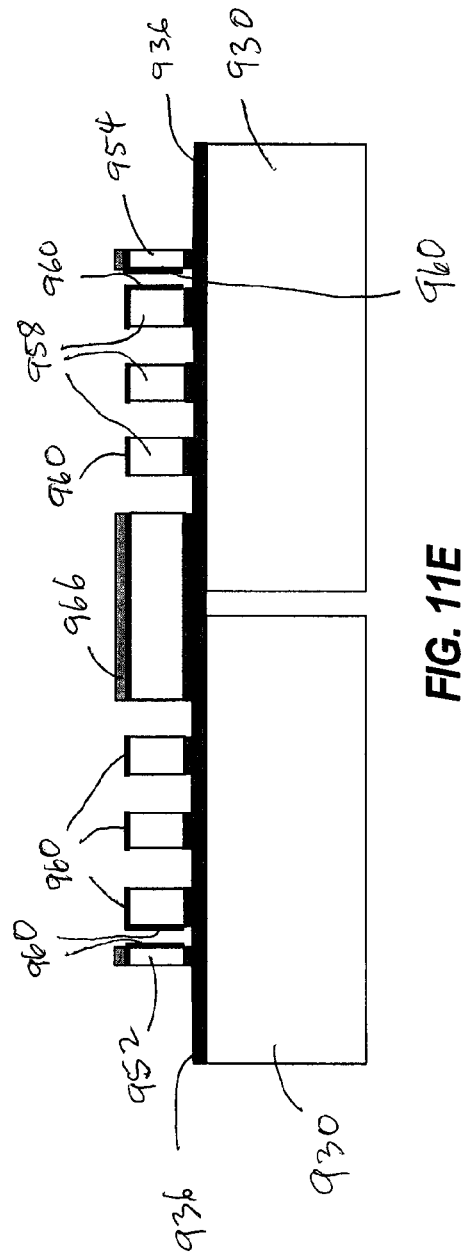
FIG. 11D
FIG. 11E

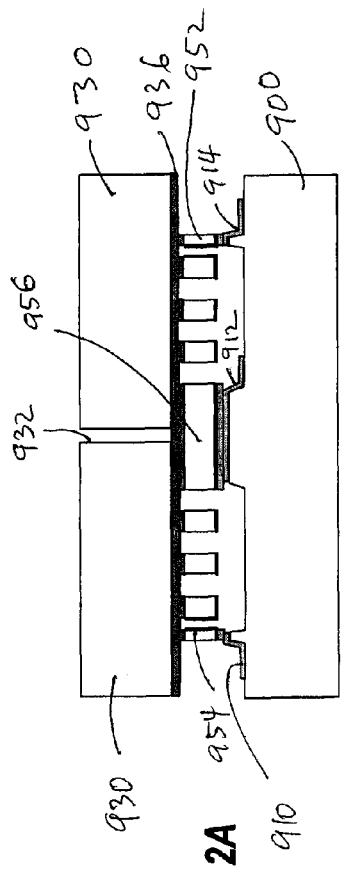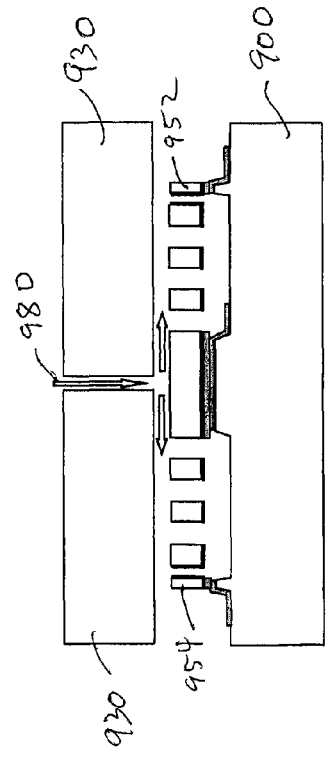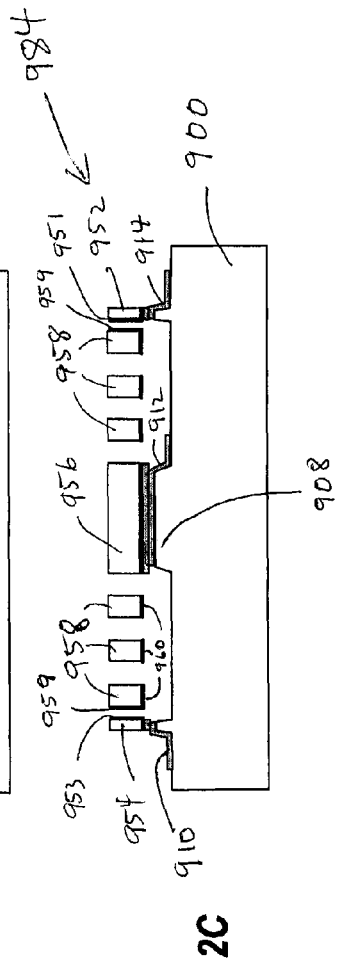
FIG. 12A
FIG. 12B
FIG. 12C

QUARTZ-BASED DISK RESONATOR GYRO WITH ULTRA-THIN CONDUCTIVE OUTER ELECTRODES AND METHOD OF MAKING SAME

CROSS-REFERENCE TO RELATED APPLICATIONS

This application is a continuation in part of U.S. patent application Ser. No. 12/179,579, filed Jul. 24, 2008 now abandoned and entitled "ALD METAL COATINGS FOR HIGH Q MEMS STRUCTURES", which is incorporated herein by reference as though set forth in full and also claims the benefit under 35 U.S.C. §119(e) of U.S. Provisional Application No. 61/082,125 filed Jul. 18, 2008 and entitled ALD Metal Coatings for High Q MEMS Resonators, U.S. Provisional Patent Application No. 60/962,176, filed Jul. 25, 2007 and entitled "ALD METAL COATINGS FOR HIGH Q MEMS RESONATORS", and U.S. Provisional Patent Application No. 60/973,703, filed Sep. 19, 2007 and entitled "ALD METAL COATINGS FOR HIGH Q MEMS STRUCTURES", which are incorporated herein by reference as though set forth in full.

This application is related to U.S. patent application Ser. No. 11/458,911, filed Jul. 20, 2006 and entitled "DISC RESONATOR GYROSCOPES," which is incorporated herein by reference as though set forth in full. This application is also related to the following United States patent applications which are all incorporated herein by reference as though set forth in full: U.S. patent application Ser. No. 10/426,931, filed on Apr. 30, 2003, entitled "A METHOD FOR FABRICATING A RESONATOR," and now issued as U.S. Pat. No. 7,237,315; U.S. patent application Ser. No. 11/881,461, filed on Jul. 27, 2007 and entitled "AN INTEGRATED QUARTZ OSCILLATOR ON AN ACTIVE ELECTRONIC SUBSTRATE;" and U.S. patent application Ser. No. 12/268,309, filed on Nov. 10, 2008, and entitled "MEMS-BASED QUARTZ HYBRID FILTERS AND A METHOD OF MAKING THE SAME."

STATEMENT REGARDING FEDERALLY SPONSORED RESEARCH OR DEVELOPMENT

The present Invention was made with support from the United States Government under contract number FA8650-05-C-7245 awarded by the Defense Advanced Project Agency (DARPA). The United States Government has certain rights in the invention.

PARTIES OF A JOINT RESEARCH AGREEMENT

The research for this application is part of a joint research agreement between HRL Laboratories, LLC of Malibu, Calif., and the Boeing Company of Chicago, Ill.

BACKGROUND

1. Field

The present disclosure generally relates to gyroscopes and also to MEMS structures and methods for fabricating a gyroscope with MEMS structures. More particularly, the present disclosure relates to a quartz-based disk resonator gyroscope.

2. Related Art

Mechanical gyroscopes are used to determine direction of a moving platform based upon the sensed inertial reaction of an internally moving proof mass. A typical electromechanical gyroscope comprises a suspended proof mass, gyroscope case, pickoffs, torquers and readout electronics. The inertial proof mass is internally suspended from the gyroscope case that is rigidly mounted to the platform and communicates the inertial motion of the platform while otherwise isolating the proof mass from external disturbances. The pickoffs to sense the internal motion of the proof mass, the torquers to maintain or adjust this motion and the readout electronics that must be in close proximity to the proof mass are internally mounted to the case which also provides the electrical feed-through connections to the platform electronics and power supply. The case also provides a standard mechanical interface to attach and align the gyroscope with the vehicle platform. In various forms gyroscopes are often employed as a critical sensor for vehicles such as aircraft and spacecraft. They are generally useful for navigation or whenever it is necessary to autonomously determine the orientation of a free object.

US Patent Publication 20070017287, "Disc Resonator Gyroscopes," describes embodiments of a disk resonator gyroscope (DRG). In U.S. patent application Ser. No. 12/179,579, filed Jul. 24, 2008 and entitled "ALD METAL COATINGS FOR HIGH Q MEMS STRUCTURES" another embodiment of a DRG is described. In these disclosures the drive electrode and sense electrode are located internally to the resonator wafer. However, this location of the drive and sense electrodes requires that the resonator be coated with a conductive layer, which also requires that a thin conductive film be conformally coated within deep trenches of the resonator. A disadvantage of the conductive coating is that the Q of the resonator is degraded. Also this the process of conductive coating within the deep trenches introduces a chance of micromasking defects being created in the trenches.

Microelectromechanical systems (MEMS) technology relates to the small scale integration of mechanical structures with electronics. In general, MEMS structures are formed on a substrate using micromachining techniques in which layers are added to the substrate and in which material is selectively removed from the substrate and/or added. The electronics are formed using conventional integrated circuit (IC) techniques.

Resonators are fundamental to RF architectures and can be used as, for example, filters and oscillators, in MEMS devices. MEMS devices which consist of silicon-based resonators have been fabricated in an attempt to integrate nanoresonators or microresonators with other electronics. Nanoresonators and microresonators are resonators which have linear dimensions on the order of nanometers and micrometers, respectively. As used herein, 'resonator' refers to any resonator incorporated in, or coupled to, a MEMS device and includes both nanoresonators and microresonators. Silicon-based resonators have shown resonant frequencies as high as 600 MHz. However, a problem with silicon-based resonators is that they have high electrical impedances and low quality factors.

Quality factor (Q) is a measure of the frequency sensitivity of a resonate body and is related to how well a resonator traps oscillation energy. In other words, a resonator with a high Q exhibits low energy loss. Thus, the higher the value of Q, the better the resonator performance, and ultimately the better the performance of the overall MEMS device. A high Q factor is especially important for improving electrical functionalities in MEMS devices for RF applications.

One of the fundamental energy loss mechanism in a resonating solid is thermoelastic damping, which is caused by irreversible heat flows in the solid as it oscillates. The magnitude of energy loss depends on the thermal conductivity of the particular substrate material of which that solid is formed. Thus, for a given geometry and a fixed temperature, Q is strongly material dependent.

Because quartz can have lower intrinsic damping than other resonator materials, the use of quartz substrates in MEMS resonators is highly desirable. Quartz-based resonators are known to have a Q several orders of magnitude larger than silicon-based resonators with similar geometry.

For at least shear-mode piezoelectric resonators, thickness of the substrate determines resonant frequency. The thinner the substrate, the higher the resonant frequency. Techniques for thinning quartz substrates to obtain high resonate frequencies are known. However, another factor that influences how well oscillation energy is trapped is resonator surface smoothness. A rough or damaged surface increases a resonator's surface/volume ratio, which in turn increases dissipation of oscillation energy. Thus, when thinning a quartz substrate to obtain a high resonate frequency, it is desirable to maintain a smooth, undamaged surface to ensure a high Q.

U.S. patent application Ser. No. 10/426,931 for "A METHOD FOR FABRICATING A RESONATOR," published as 2004/0211052 and now issued as U.S. Pat. No. 7,237,315, is co-owned with the present application and is incorporated herein in its entirety. The U.S. Pat. No. 7,237,315 patent is addressed to a method for fabricating a quartz nanoresonator that can be integrated on a substrate along with other electronics, disclosing methods for fabricating and integrating quartz-based resonators on a high speed substrate for integrated signal processing that utilize a combination of novel bonding and etching steps to form smooth, ultra-thin quartz-based resonators. The quartz resonators made in accordance with these methods can achieve a frequency in excess of 1 GHz.

U.S. patent application Ser. No. 11/881,461 for "AN INTEGRATED QUARTZ OSCILLATOR ON AN ACTIVE ELECTRONIC SUBSTRATE" is also co-owned with the current application and incorporated herein in its entirety. The Ser. No. 11/881,461 application discloses a method to attach a full wafer of quartz resonators to a substrate wafer using low temperature bonding, allowing a complete integration of a wafer of resonators to a wafer containing an array of oscillator circuits. As well, the Ser. No. 11/881,461 application also discloses integrating a quartz resonator with active electronics to form a low power, high performance (low vibration sensitivity, low temperature drift, and low phase noise) oscillator with reduced stray signals.

Quartz is an insulating material. Thus, to electrostatically drive or sense motion of a quartz-based resonator, the resonator's surface must be made conductive by forming an electrically continuous metal film thereon for electrodes. The thickness of the metal film, as well as the uniformity of that thickness, affects both resonate frequency and native Q of the resonator. The conductivity of the metal film affects RC time constants and impedances, which are critical for high performance in many MEMS devices. For example, electrically continuous thin metal coatings are desired for high frequency (>2 Ghz) oscillators and high performance quartz filters. The isolation and bandwidth of high performance quartz filters depend on making metal electrodes with ultra-thin films for optimal modal properties. For oscillators, a thick metal electrode reduces the frequency and can reduce the ultimate Q. Therefore, the best performing oscillators typically have very thin electrodes.

Deposition of metal coatings on electronic and MEMS structures has been restricted to the conventional thin film processes of sputtering, electron beam evaporation, or thermal evaporation. These processes are only slightly conformal (with sputtering being the best) on high-aspect-ratio structures, as these processes generally coat structures along a line-of-sight from the source, resulting in non-uniform thickness metal films which introduce stress gradients over temperature, degrading Q. Chemical Vapor Deposition (CVD) processes are more conformal than sputtering, electron beam evaporation, or thermal evaporation, but are not able to produce substantially pure metal films, desired for high conductivity.

Another problem with sputtering, electron beam evaporation, or thermal evaporation processes is the films generally form grain structures due to the kinetics of the grow process. Slippage between these grains during mechanical bending results in energy loss, degrading Q. Also, the grain structure limits the minimum thickness which can be applied in order to obtain electrical continuous films, also degrading Q as well as resonate frequency. The thickness of the metal film can not be controlled on the monolayer scale using these processes.

Atomic Layer Deposition (ALD) is a gas phase chemical process used to form extremely thin conformal coatings on a substrate. ALD is similar in chemistry to CVD, except that the ALD reaction breaks the CVD reaction into two sequential self-limited reactions between gas phase reactants (also known as precursors) and the growth surface.

Because ALD film growth is self-limited it is possible to control deposition on the atomic scale, as fine as approximately 0.1 angstroms per monolayer. ALD has unique advantages over other thin film deposition techniques, as ALD grown films are highly conformal, completely amorphous and chemically bonded to the substrate with essentially no grain structure. In addition, since the reactions only occur at the surface as opposed to in the gas phase as in CVD, no particulates are produced and the surface finish reproduces the original surface topology.

The use of ALD for ultra-thin film deposition of dielectrics has been used for several years in the IC industry, primarily in the fabrication of gate insulators and conformal passivation layers. However, successful demonstration of methods and chemistry to deposit pure metal films by Atomic Layer Deposition techniques was only first reported in 2005. (See Solid-State Lett. 8, C99 (2005). See also APL, Vol. 89, pp. 043111-1 to 043111-3 (2006).) In these ALD metal processes a metal precursor is introduced into a vacuum chamber. The metal precursor reacts with functional groups, usually oxygen, on the growth surface to deposit a monolayer of the desired metal. This precursor and oxidized hydrocarbon ligands from the precursors are then purged from the system. Next, a second precursor, such as oxygen, is introduced into the system. The second precursor combines with unreacted ligands on the surface and the metal to produce a clean oxide surface. Byproducts of water and carbon dioxide are produced, which are pumped away.

An all-quartz resonator gyroscope in accordance with the prior art is disclosed in U.S. patent application Ser. No. 12/179,579, filed Jul. 24, 2008 and entitled "ALD METAL COATINGS FOR HIGH Q MEMS STRUCTURES." In that disclosure the drive electrode and sense electrode are located internally to the resonator wafer, as shown in FIG. 1A. This internal location of the drive and sense electrodes requires that the quartz disk resonator be coated with a conductive layer for the drive and sense electrodes. The conductive layer is a thin conductive film that is conformally coated within deep trenches in the system of interconnected rings on the disk resonator. However, a disadvantage of this prior art quartz resonator is that Q of the resonator is significantly degraded, when the conductive coatings are applied to all of the resonator portions.

What is needed is a quartz based disk resonator for a disk resonator gyroscope with improved Q. Since the bias drift of the gyro is inversely dependent on $Q^2$, increasing the Q translates directly into less drift for the gyro. The embodiments of the present disclosure answer this and other needs.

SUMMARY

In accordance with a first embodiment of the present disclosure, a disk resonator gyroscope includes a quartz base, a quartz resonator disk having a central pillar connected to the base, the quartz resonator disk having a surface facing the base and having plurality of circumferential slots in the surface of the quartz resonator disk around the central pillar, and an electrode comprised of quartz and connected to the base outside of an outer edge of the resonator disk.

In one aspect of this embodiment the base comprises fused quartz, the resonator comprises fused quartz, and the electrode comprises fused quartz.

In another aspect of this embodiment a gap between the electrode and the outer edge of the resonant structure is about 50 microns.

In another aspect of this embodiment the electrode further comprises a drive electrode and a sense electrode.

In yet another aspect of this embodiment the base has about a 500 μm thickness and the resonator has about a 125 pm thickness.

In another aspect of this embodiment the base further comprises a first raised area and metal deposited on the first raised area for connecting to the central pillar, and a second raised area and metal deposited on the second raised area for electrical connection and bonding to the electrode.

In yet another aspect of this embodiment the first raised area has a height of about 3-4 μm and the second raised area has a height of about 3-4 pan.

In another aspect this embodiment further comprises a conductive film on the surface of the resonant structure, the outer edge of the resonant structure, the central pillar, and a top surface and an inner wall of the electrode, wherein the inner wall of the electrode faces the outer edge of the resonant structure. The conductive film may be an Atomic Layer Deposition metal and be less than 100 nanometers thick. The conductive film may comprises one of Pt, Ru, Rh, Pd, Re, or Ir.

In yet another aspect this embodiment further comprises a conductive coating over the conductive film on the central pillar and on the top surface of the electrode for interconnect and bonding to the base. The conductive coating may be gold and about 0.5 μm thick.

In accordance with another embodiment of the present disclosure, a method for producing a disk resonator gyroscope comprises providing a base substrate, providing a handle wafer with a release hole, bonding a release wafer to the handle wafer, bonding a resonator wafer to the release wafer, etching the resonator wafer to form a disk resonator, a sense electrode, and a drive electrode, the disk resonator having an outer edge and a central pillar, and the sense and drive electrodes outside the outer edge of the disk resonator and each having a surface facing the outer edge of the disk resonator, selectively applying a conductive film onto the disk resonator such that the conductive film is on a side of the disk resonator opposite the release wafer, on the outer edge of the disk resonator, and on the surfaces of the sense and drive electrodes that are facing the outer edge of the disk resonator, selectively applying conductive metal onto the sense and drive electrodes and onto the central pillar of the disk resonator, bonding the sense and drive electrodes and the central pillar of the disk resonator to the base substrate, and releasing the handle wafer by introducing a dry release agent into the release hole such that it undercuts the release wafer.

In another aspect of this embodiment the base substrate is fused quartz, the handle wafer is fused quartz, the release wafer is silicon and the resonator wafer is fused quartz.

In another aspect of this embodiment providing base substrate further comprises etching the base substrate to form first, second, and third raised areas. depositing metal on the first, second and third raised areas, the first raised area for supporting the central pillar, the second raised area for supporting the sense electrode, and the third raised area for supporting the drive electrode.

In another aspect of this embodiment bonding a release wafer to the handle wafer further comprises thinning the release wafer. The thinning may include grinding and chemical mechanical planarization.

In yet another aspect of this embodiment bonding a resonator wafer to the release wafer further comprises thinning the resonator wafer. The thinning may include grinding and chemical mechanical planarization.

In another aspect of this embodiment etching the resonator wafer to form a disk resonator, a sense electrode, and a drive electrode comprises performing deep reactive ion etching (DRIE).

In yet another aspect of this embodiment selectively applying a conductive film comprises atomic layer deposition of a noble metal. The noble metal may be one of Pt, Ru, Rh, Pd, Re, or Ir. Selectively applying a conductive film comprises using a conformal mask which may use spray lithography.

In another aspect of this embodiment bonding the sense and drive electrodes and the central pillar of the disk resonator to the base substrate comprises metal to metal thermal compression.

In another aspect of this embodiment releasing the handle wafer by introducing a dry release agent into the release hole comprises using a $XeF_2$ dry release process.

In yet another aspect of this embodiment the method for producing a disk resonator gyroscope further comprises vacuum sealing the disk resonator gyroscope with a quartz capping wafer.

In another aspect of this embodiment selectively applying conductive metal onto the sense and drive electrodes and onto the central pillar of the disk resonator comprises applying gold over the conductive film on the central pillar and on the sense and drive electrodes on the side of the disk resonator opposite the release wafer.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 11A-11E illustrate a manufacturing process for a resonator for an all-quartz resonator gyroscope in accordance with the present disclosure;

FIGS. 12A-12C illustrate a manufacturing process for completing the fabrication of an all-quartz resonator gyroscope in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Bilayer High Q Coating and Method

Figure 7:
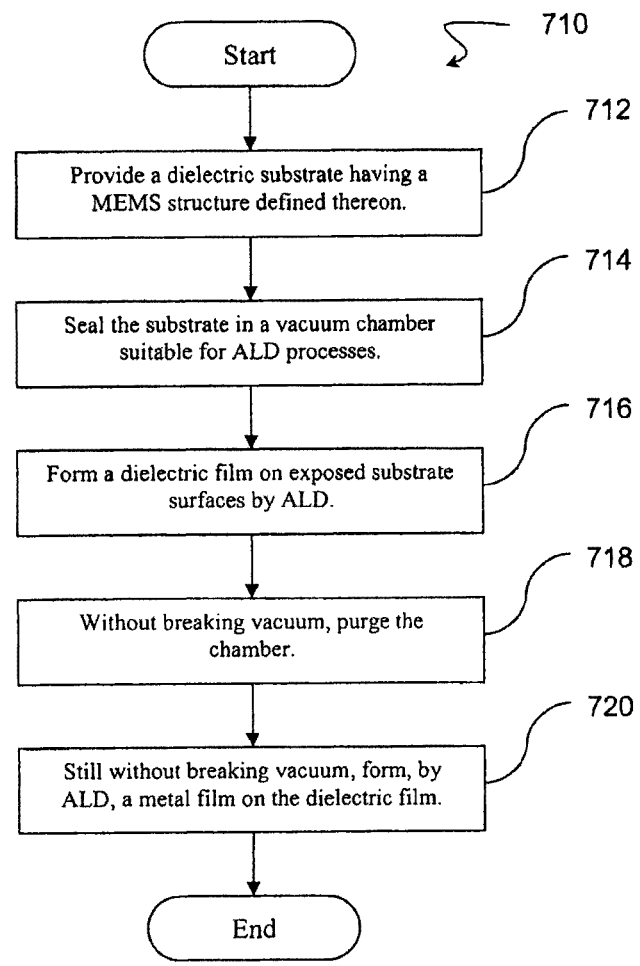
FIG. 7 illustrates an exemplary method for forming a bilayer conductive coating on a MEMS structure in accordance with the prior art.

FIG. 7 is a flowchart of a method 710 of forming an ultra-thin, highly conformal and highly conductive bilayer dielectric/metal coating. In operation 712, a dielectric substrate having at least one resonate structure defined thereon is provided. The dielectric substrate could be, for example, quartz, fused quartz, fused silica, or any other dielectric having desired properties.

In operation 714 the dielectric substrate is sealed in a vacuum chamber suitable for Atomic Layer Deposition processes. In operation 716, an ALD dielectric film is formed on exposed substrate surfaces. The ALD dielectric film can be an ALD $Al_2O_3$ (aluminum oxide) amorphous film formed using trimethylaluminum as a first precursor and water vapor gasses as a second precursor for the Atomic Layer Deposition. ALD $Al_2O_3$ amorphous films are known to exhibit a reactive chemistry which can serve as an adhesion layer or seed layer for other ALD layers. Reports in the literature have shown that $Al_2O_3$/ZnO (aluminum oxide/zinc oxide) composite ALD coatings can be used to prevent charging in the dielectric layer of RF MEMS switch devices. These films have resistivities in the $10^{13}$ to $10^{16}$ Ω-cm range. However, the use of $Al_2O_3$/metal ALD composite films is heretofore unknown for producing highly conductive coatings for metal electrodes on MEMS structures.

Typically, for $Al_2O_3$ amorphous films, in operation 714 the substrate will be heated to 150-200° C. and the background pressure in the chamber will be brought to the $10^{-6}$ Torr range before deposition will begin. In one embodiment, the trimethylaluminum is heated to attain a vapor pressure of approximately 20 mTorr, and the trimethylaluminum and the water vapor gasses are introduced into the chamber sequentially, in pulses of about 10-15 seconds duration each and at an operating pressure of approximately 1 Torr, with a 15 second argon (Ar) or nitrogen (N) purge between each reactant at an operating pressure of approximately 0.9 Torr. The trimethylaluminum can be carried into the chamber using an Ar or N flow with the total gas flow rate of approximately 300 SCCM. It should be understood that these process parameters can be varied to obtain desired results.

Next, in step 718, without breaking the vacuum, the chamber is purged. Then, in operation 720, still without breaking the vacuum, an ALD metal film is formed on the ALD dielelectric film. As will be understood, the ALD metal film can be formed to any thickness desired by varying the number of monolayers deposited on the substrate. Preferably, the metal is a pure noble metal, such as, for example, rhodium (Rh), platinum (Pt), ruthenium (Ru), rhenium (Re), palladium (Pd), or iridium (Ir), and the oxidant (second precursor) is $O_2$. For rhodium, the first precursor can be rhodium (III) acetylacetonate. For platinum, the first precursor can be trimethyl (methylcylopentadienyl) platinum.

The ALD process parameters for depositing the ALD metal film in operation 720 can be similar to those discussed above regarding the $Al_2O_3$ ALD dielectric film. A high operating pressure, for example approximately 1 Torr, provides for highly conformal coatings, while the monolayer deposition process yields coatings that are both ultra-thin and highly uniform, even on high-aspect-ratio (>5:1) structures. Thus, damping, due to coating thickness, is minimized, and stress gradients over temperature, introduced by non-uniform coatings, are reduced.

The actual measured resistivities (ρ) of ALD metal films formed by the process described in operation 720 are near bulk metal resistivity values of $10^{-5}$ to $10^{-6}$ Ω-cm, as shown below, which provides for highly conductive coatings and thus excellent electrical performance characteristics.

Measured Resistivity of ALD Metal Films $\rho=9.1\times10^{-6}$ Ω-cm for 50 nm Pt (bulk value $9.8\times10^{-6}$ Ω-cm)

$\rho=2.0\times10^{-5}$ Ω-cm for 30 nm Ru (bulk value $1.0\times10^{-5}$ Ω-cm)

Additionally, an ALD $Al_2O_3$ amorphous film beneath an ALD metal film actually increases a resonator's Q compared to coating that resonator with an ALD metal film alone. This is due to the reduction of surface interfacial slippage and surface passivation that the ALD $Al_2O_3$ amorphous film provides. For example, disc resonators, to be described in detail below, having bilayer ALD $Al_2O_3$/Pt or $Al_2O_3$/Ru coatings formed according to the method of FIG. 7 have shown to have performance gains of 20% over comparable disc resonators having only Pt or Ru coatings, respectively.

Alternate Metal High Q Coating and Method

In an alternate method for forming an ultra-thin, highly conformal and highly conductive coating, though not shown in detail in the Figures, an ALD metal film is deposited directly on a dielectric substrate having at least a MEMS structure defined thereon. That is, in this alternate method, the ALD dielectric film is not utilized. Rather, the High Q coating consists of only an ALD metal film. As above, the dielectric substrate could be, for example, quartz, fused quartz, fused silica, or any other dielectric having desired properties. And, the MEMS structure could be a resonator. Also, preferably the metal is a noble metal. The same ALD process parameters and precursors discussed above in relation to step 720 of FIG. 7 can be used in this alternate method. For the same reasons as above, the resulting conductive coatings are highly conformal, have a highly uniform thickness, and have resistivities approaching that of bulk metal values. It will be appreciated that this alternate metal coating and method can be utilized whenever desired.

It should be understood that formed bilevel High Q coatings or alternative metal High Q coatings can be etched, patterned, or otherwise processed as desired and/or necessary in certain applications.

These methods for forming High Q coatings, disclosed above, will now be further discussed in regard to fabricating an all-quartz disc resonator gyroscope. However, the present disclosure is applicable to any crystalline or amorphous dielectric MEMS structure design, geometry, or architecture where ultra-thin, highly conformal and highly conductive coatings are desired, including, for example, shear mode piezoelectric resonators having any desired fundamental mode resonance, including those in excess of 100 MHz. Further, a resonator fabricated in accordance with these methods may be utilized as any desired component in a MEMS device, including oscillators and filters.

Disc Resonator Gyroscope (DRG) Architecture

Figure 1A:
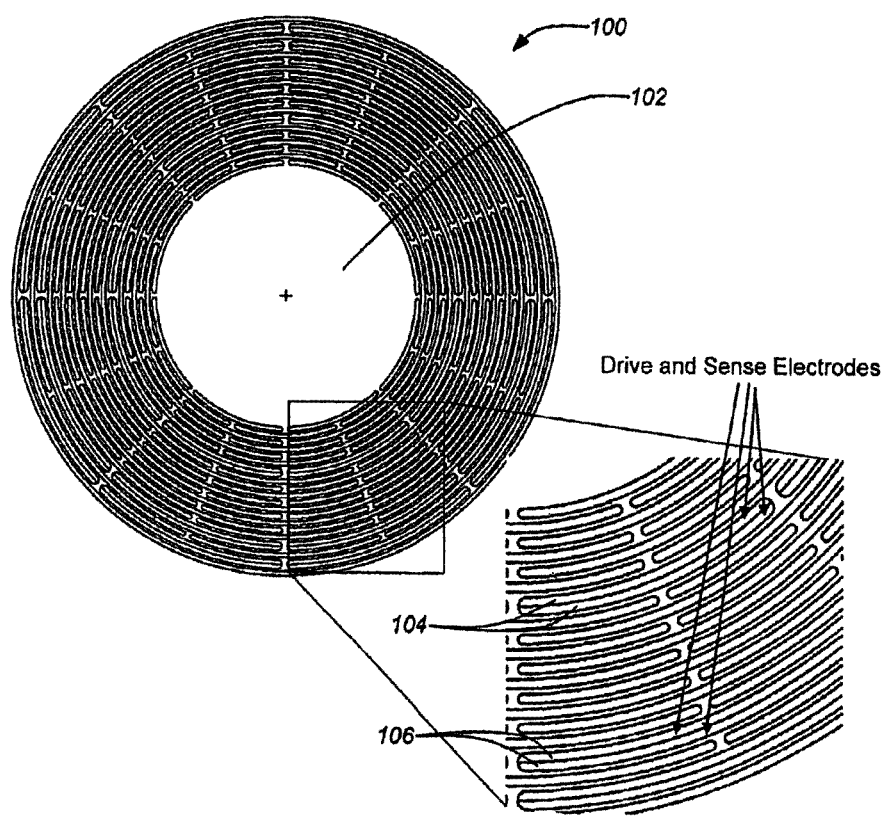
FIG. 1A shows a typical disc resonator architecture for an all-quartz resonator gyroscope in accordance with the prior art.

FIG. 1A shows a typical disc resonator 100 architecture for an all-quartz resonator gyroscope. A typical embodiment comprises a gyroscope including a planar disc resonator 100 fabricated of fused quartz in which deep reactive ion etching may be used to slot the disc into a system of interconnected rings supported at a central support 102 with internal drive and sense electrodes 104, 106. The internal drive and sense electrodes 104, 106 are formed from the quartz material left in the circumferential slots of the disc resonator 100. The drive and sense electrodes 104, 106 are electrostatic and may operate in paired halves within a single slot, e.g. an inner half and outer half divided along the length of the slot. Thus, the drive and sense electrodes 104, 106 generally interact with the disc resonator in the plane of the disc across narrow gaps between the electrodes 104, 160 and the disc structure. Location of the drive and sense electrodes 104, 106 can be varied, however, it is desirable to position the sense electrodes 106 towards the outside edge of the disc resonator 100 to enhance sensitivity. Both the central support 102 and the drive and sense electrodes 104, 106 are supported at high spots on an etched quartz baseplate. Electrical connections to the drive and sense electrodes 104, 106 can be achieved through an etched metallic layer deposited on the etched quartz baseplate as described hereafter. Additional bias (or trim) electrodes may also be employed to assist in tuning the resonator and improving overall performance. The bias electrodes are incorporated into the structure along with the drive and sense electrodes and are used for tuning the frequency of the modes electrostatically for optimal performance.

Figure 1B:
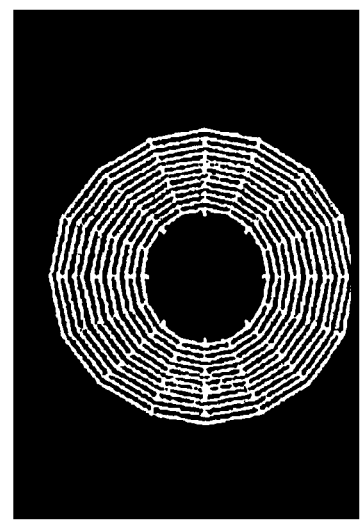
FIG. 1B describes the operation of a disc resonator for an all-quartz resonator gyroscope in accordance with the prior art.
Figure 1B:
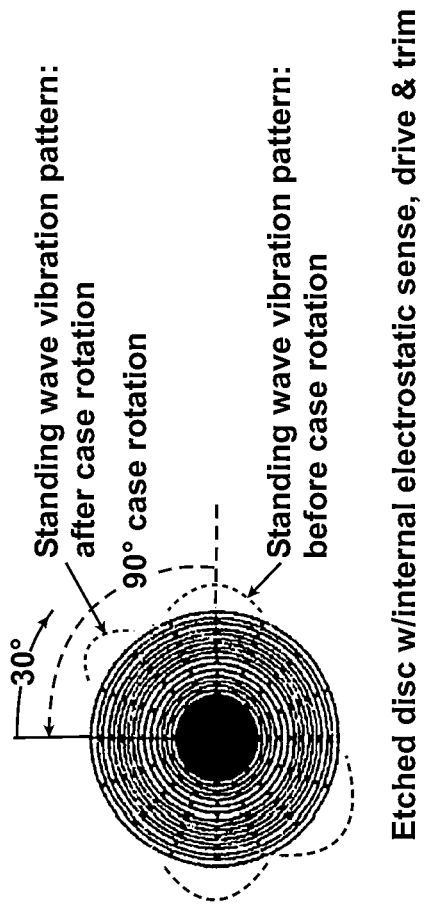

The FIG. 1B describes the operation of a disc resonator for an all-quartz resonator gyroscope. The left panel illustrates an analytical model of a typical disc resonator. The right panel operation of a DRG. In operation, the disc resonator is excited such that a standing wave vibration pattern (which may be likened to the "wine glass" mode of the known hemispherical resonator gyroscope) moves in response to rotation of the gyroscope case as shown in the right image. Coriolis forces couple two degenerate modes of the disc to yield a new standing wave pattern after rotation of the DRG. In the example shown, under a case rotation (i.e. rotation of the entire DRG) of 90 degrees, the standing wave pattern shifts approximately 60 degrees (90 degrees less a 30 degree shift). The disc resonator architecture may comprise an axisymmetric resonator supported at a central node. A large number of circumferential slots occupied by the drive and sense electrodes 104, 106 provide large area for capacitive electrode actuation and sensing yielding a large signal to noise (S/N) ratio. The architecture lends itself to simple two dimensional design, homogeneous material and batch fabrication and inexpensive manufacturing.

Figure 1C:
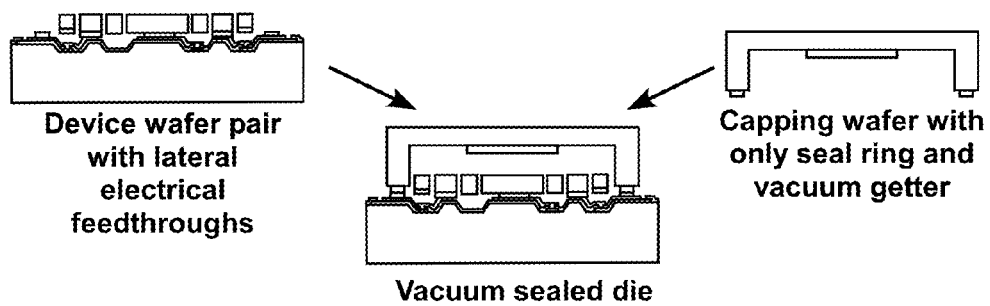
FIG. 1C illustrates the configuration of an all-quartz disc resonator gyroscope including vacuum sealing in accordance with the prior art.

FIG. 1C illustrates the overall configuration of an all-quartz disc resonator gyroscope including vacuum sealing which will be detailed hereafter. The all quartz construction of the disc resonator, baseplate wafer, and cap wafer provides a design with low temperature sensitivity. The handle wafer employed in manufacturing helps minimize debris, shorting and footing issues. An Au—Au thermo-compression bond may be employed for resonator attachment to the baseplate using 3 μm accuracy for the critical bonding step. In addition, device wafer pair fabrication can be fully decoupled from vacuum sealing to enable early wafer-level vacuum testing of the gyroscope.

U.S. Pat. No. 6,915,215 to M'Closkey et al., which is incorporated by reference herein, describes exemplary control architectures for DRG embodiments described herein such as the all-quartz disc resonator gyroscope. Control of a DRG can be accomplished through the use of bulk complementary metal oxide semiconductor (CMOS) low power digital control circuit (e.g., an application specific integrated circuit [ASIC]) and/or a silicon-on-insulator (SOI) CMOS analog interface in the exemplary circuit designs described therein.

Figure 1D:
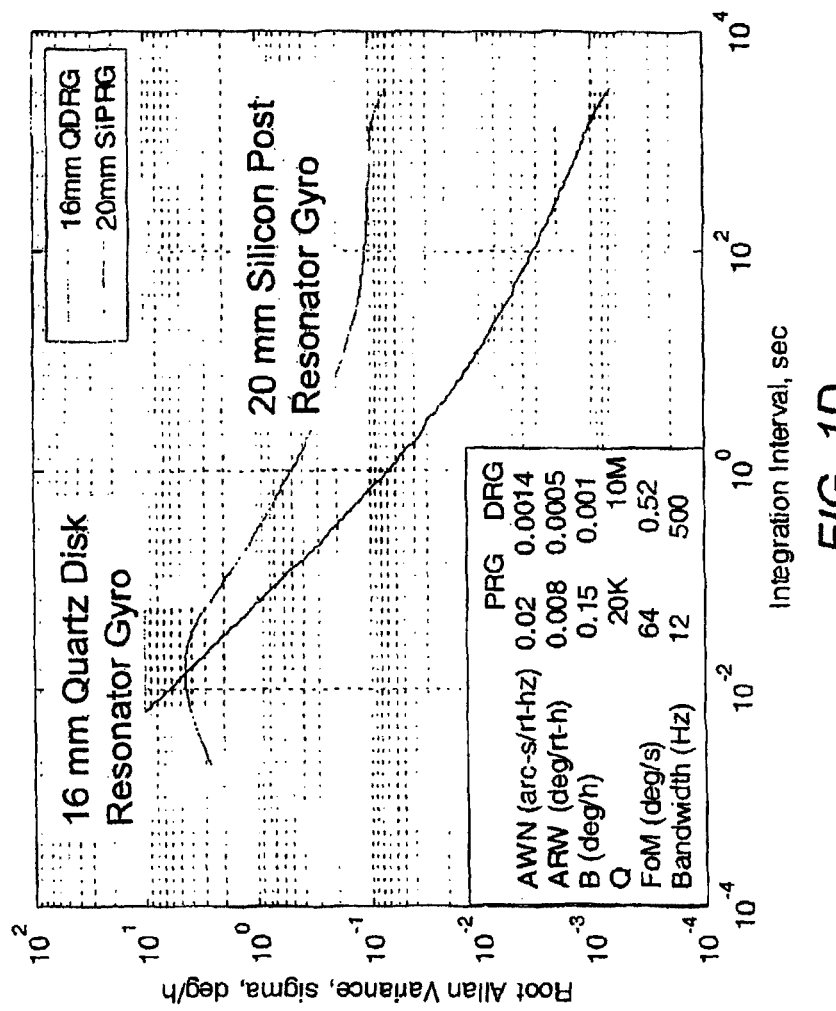
FIG. 1D illustrates performance of an exemplary all-quartz disc resonator gyroscope in accordance with the prior art.

FIG. 1D illustrates performance of an exemplary all-quartz disc resonator gyroscope. The performance gain of an exemplary all-quartz disc resonator gyroscope over a comparable silicon post resonator gyroscope is shown in the sample plot. Prior art post resonator gyroscopes operate using rocking modes of post fixed to a planar electrostatically driven and sensed plate. One example is described in U.S. Pat. No. 5,894,090 to Tang et al., which is incorporated by reference herein.

All-Quartz Disc Resonator Gyroscope and Manufacturing Process

Four fused quartz wafers may be used to form the vacuum-sealed disc resonator gyroscope (DRG). One quartz wafer can serve as a temporary handle for the quartz resonator wafer processing of the another quartz wafer. The two remaining quartz wafers can be used as a vacuum cap and an electrical baseplate, respectively. It should be noted that in description hereafter exemplary embodiments are illustrated through a two-dimensional side view cross sections showing the processes for developing the basic electrical and structural elements involved. Those skilled in the art will understand application of those processes to the exemplary disc resonator architecture of FIG. 1A or other MEMS structures.

Figure 2A:
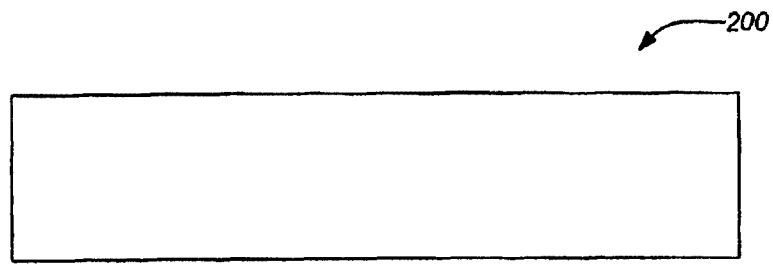
FIGS. 2A-2F illustrate a manufacturing process of a baseplate wafer for an all-quartz resonator gyroscope in accordance with the prior art.
Figure 2B:
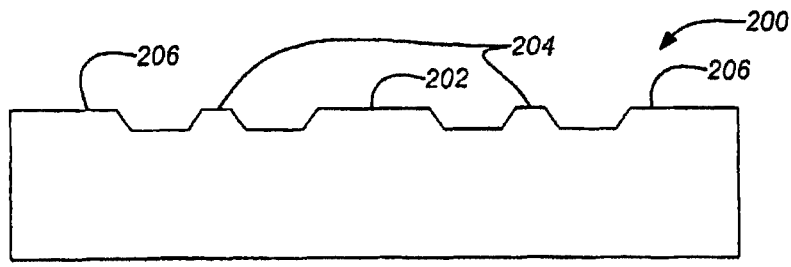
Figure 2C:
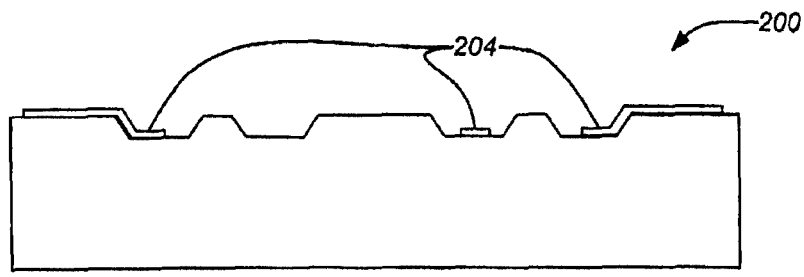
Figure 2D:
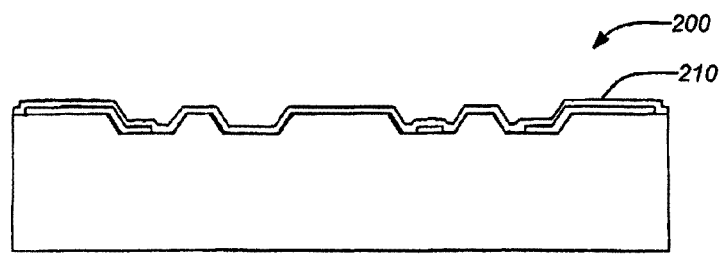
Figure 2E:
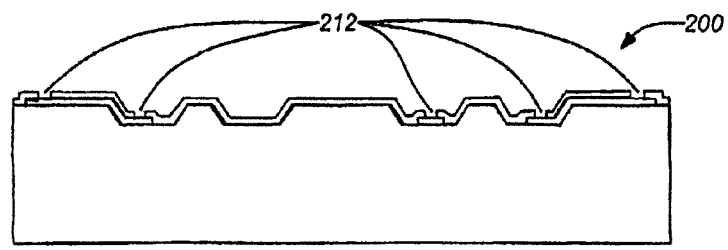
Figure 2F:
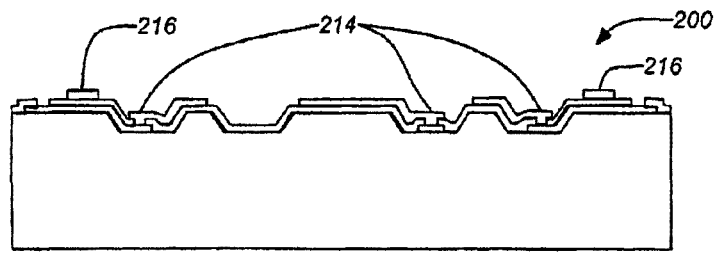

FIGS. 2A-2F illustrate a manufacturing process of a complete baseplate wafer for use in an all-quartz resonator gyroscope in sequence. The quartz baseplate wafer fabrication begins with a recess etch of the fused quartz wafer 200 as shown in FIG. 2B using either a fluorine-chemistry plasma or hydrofluoric acid process or any other known process capable of etching quartz to yield the appropriate pattern (e.g. matching the planar resonator layout of FIG. 1A) of recesses leaving high spots for the central support location 202 of the planar resonator and to provide contacts for the electrode locations 204 as well as the DRG case wall location 206 (for the cap wafer detailed hereafter). The etched recesses provide areas in which electrical circuit interconnects can be deposited to appropriately connect the drive and sense electrodes to the control circuitry. Following the etching, Ti/Au or Cr/Au (200 Å/5000 Å) are metallized on the wafer 200 to form the interconnects 208 for the electrodes as shown in FIG. 2C. A plasma enhanced chemical vapor deposition (PECVD) silicon dioxide or silicon nitride (5000 Å) is then deposited to form the inter-metal dielectric layer 210 as shown in FIG. 2D. Reactive ion etching (RIE) may then be used to open vias 212 through the inter-metal dielectric layer 210 as shown in FIG. 2E. A second metallization of Ti/Au or Cr/Au (200 Å/5000 Å) may be used to deposit the metal bond pads 214 and a vacuum seal ring 216 as shown in FIG. 2F. This concludes the baseplate wafer 200 fabrication.

Figure 2G:
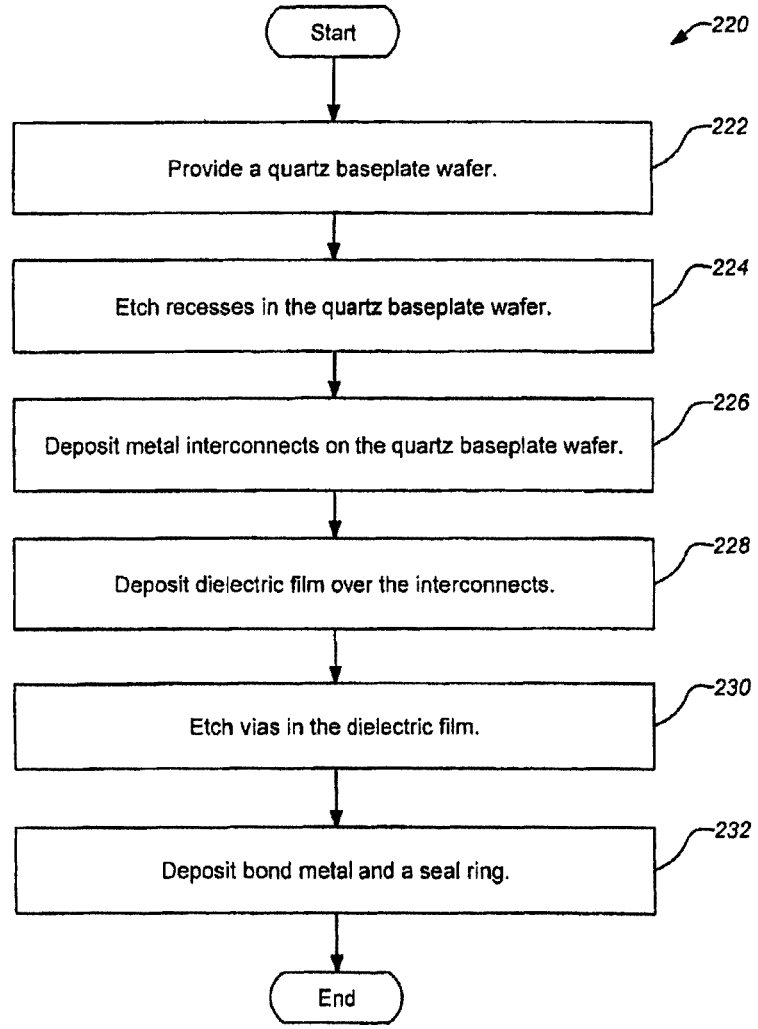
FIG. 2G is a flowchart of an exemplary method of manufacturing a baseplate wafer for an all-quartz resonator gyroscope in accordance with the prior art.

FIG. 2G is a flowchart of an exemplary method 220 of manufacturing a baseplate wafer for an all-quartz resonator gyroscope. In operation 222, a first fused quartz wafer is provided for a baseplate as shown in FIG. 2A. In operation 224, recesses are etched in the fused quartz baseplate as shown in FIG. 2B. In operation 226, metal interconnects are deposited on the fused quartz baseplate as shown in FIG. 2C. In operation 228, dielectric film is deposited over the interconnects as shown in FIG. 2D. In operation 230, vias are etched in the dielectric film as shown in FIG. 2E. And in operation 232, bond metal and a seal ring are deposited as shown in FIG. 2F. The seal ring marks out the periphery of the disc resonator and the bond metal is used to mount the disc resonator at the central support and the electrodes throughout the interior of the disc.

Figure 3A:
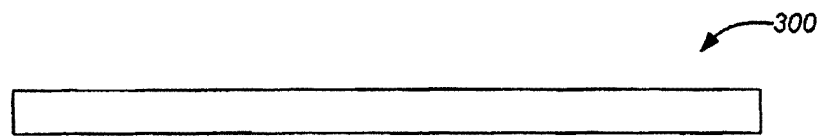
FIGS. 3A-3H illustrate a manufacturing process of a resonator wafer for an all-quartz resonator gyroscope in accordance with the prior art.
Figure 3B:
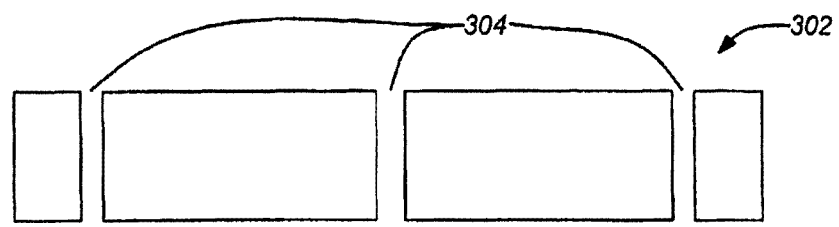
Figure 3C:
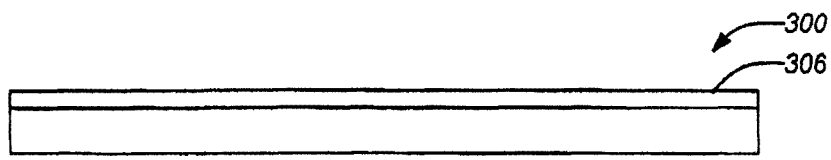
Figure 3D:
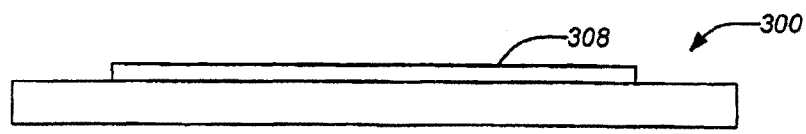
Figure 3E:
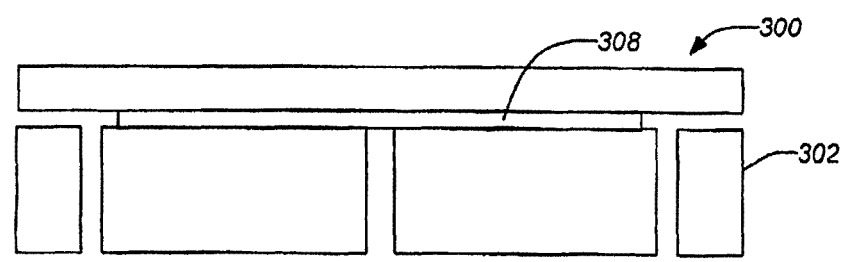

FIGS. 3A-3G illustrate a manufacturing process of a resonator wafer for an all-quartz resonator gyroscope, in sequence. The starting materials for the resonator wafer process are a full fused quartz resonator wafer 300 (FIG. 3A) and another fused quartz wafer to be used as a handle wafer 302 (FIG. 3B) having release holes 304 (which may be ultrasonically machined through it). A silicon thin film 306 (approximately 1 μm) is deposited on the resonator wafer 300 using a plasma enhanced chemical vapor deposition (PECVD) as shown in FIG. 3C or using SOI technology as will be understood by those skilled in the art. A chemical mechanical planarization (CMP) step may be carried out if there are any unacceptable surface imperfections due to the deposition. The silicon film may then be patterned 308 using a fluorine chemistry RIE as shown in FIG. 3D in regions that are not required for later bonding the etched resonator to the baseplate wafer. This will speed the final release step. In general, depending upon the applied resonator architecture the pattern will provide enough bonding area in the appropriate locations so that the resonator wafer 300 is stable on the handle wafer 302, but allowing relatively easy release of the handle wafer 302 in later processing. The resonator wafer 300 with patterned silicon film 308 is then bonded to the handle wafer 302 with through holes as shown in FIG. 3E.

Figure 3F:
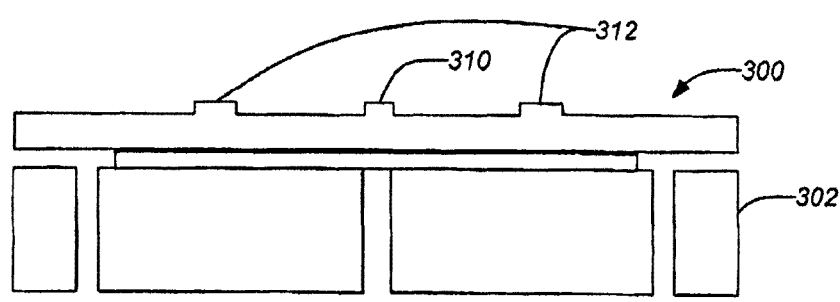

FIG. 3F illustrates an optional process of additional etching of the bottom of the disc resonator wafer 300 as shown. This may be done to form raised areas for the central support location 310 and electrode locations 312 where the baseplate wafer 200 will be bonded in subsequent processing.

Figure 3G:
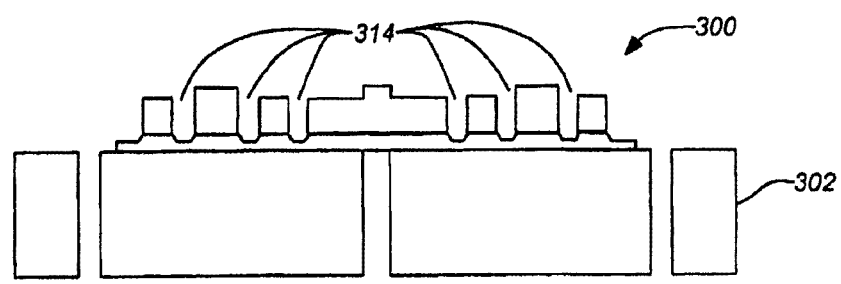
Figure 3H:
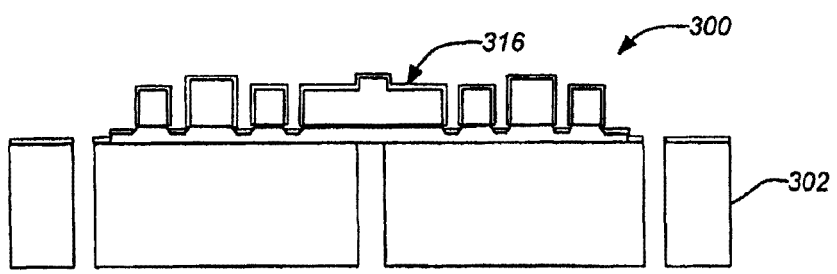

FIG. 3G then illustrates deep reactive ion etching (DRIE) that may be used to define the resonator pattern (e.g. the pattern shown in FIG. 1A) including the electrodes and central support with straight side walls 314 completely through the resonator wafer 300. DRIE of fused quartz defines resonator with straight side walls and minimal surface roughness. Note that the electrodes are now embedded within the resonator wafer 300 but physically disconnected from the resonator structure. Thus, the handle wafer 302 now supports the pattern of resonator structure and electrodes in the resonator wafer 300.

Figure 8:
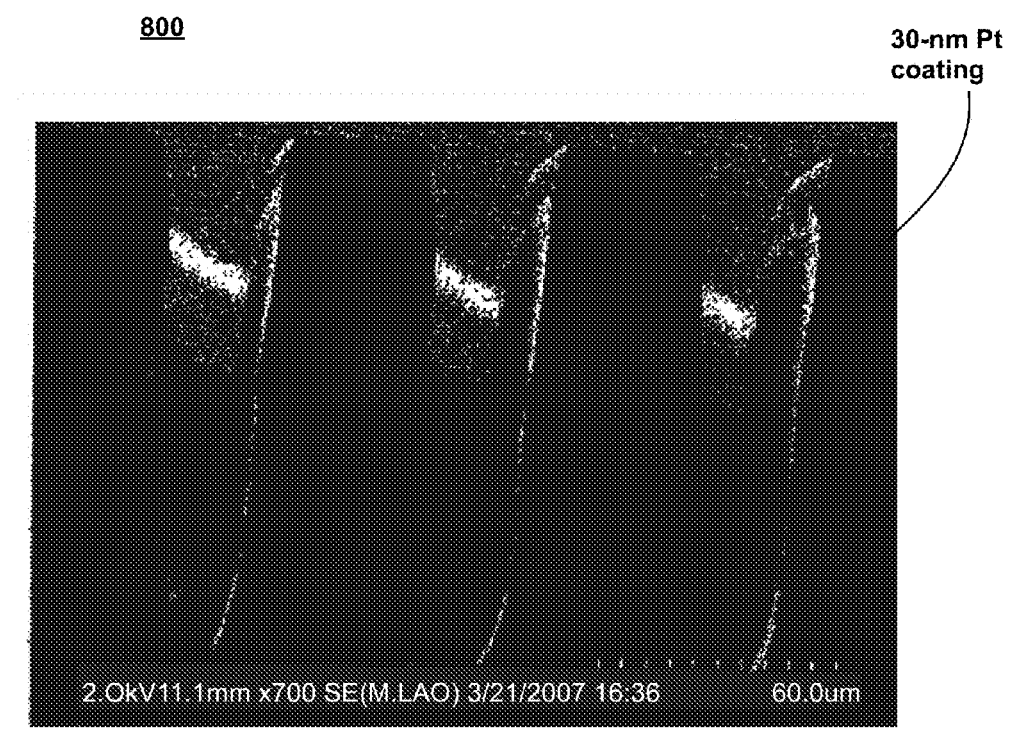
FIG. 8 is a scanning electronic microscope image of a high-aspect-ratio resonator having a conductive coating formed thereon in accordance with the prior art.

The bonding surface of the resonator and the sidewalls are then metallized 316 with either the bilayer High Q coating or the alternate metal High Q coating, each discussed above. Both provide highly conformal and highly uniform coatings on the atomic scale. Thus, the thickness of a conductive coating can be reduced to a minimum while maintaining a continuous coating in high aspect ratio structures, including those having an aspect ratio in excess of 5:1. For example, FIG. 8 is a scanning electron microscope image 800 of the etched disc resonator wafer 300 having a 30 nm-thick platinum coating formed directly thereon in accordance with the alternate metal High Q method described above.

Figure 3I:
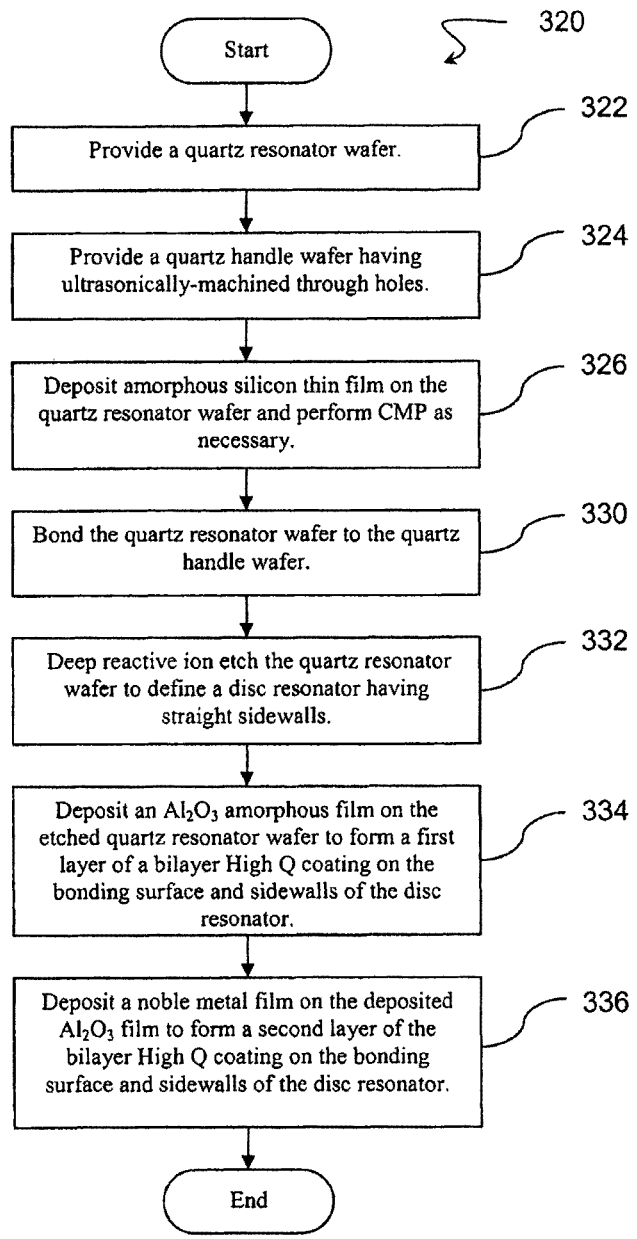
FIG. 3I is a flowchart of an exemplary method of manufacturing a resonator wafer for an all-quartz resonator gyroscope in accordance with the prior art.

FIG. 3I is a flowchart of a method 320 of manufacturing a resonator wafer for an all-quartz resonator gyroscope, including the bilayer High Q coating. In operation 322, a second fused quartz wafer is provided for the disc resonator as shown in FIG. 3A. In operation 324, a third fused quartz wafer is provide for a handle with ultrasonically-machined through holes as shown in FIG. 3B. In operation 326, amorphous silicon thin film is deposited on the second wafer with chemical mechanical planarization (CMP) performed as necessary as shown in FIG. 3C. In operation 328, silicon is patterned on the second wafer as shown in FIG. 3D. In operation 330, the second wafer is bonded to the third wafer as shown in FIG. 3E. The wafers may be bonded with plasma-assisted room temperature bonding. Though not shown in FIG. 3I, an optional process of additional etching of the bottom of the disc resonator wafer for electrode and support contacts as shown in FIG. 3F, can be performed subsequent to operation 330 and before operation 332.

In operation 332, the second wafer is deep reactive ion etched (DRIE) to define the disc resonator with straight side walls as shown in FIG. 3G. In operation 334, an $Al_2O_3$ amorphous film is deposited on the etched quartz resonator wafer by Atomic Layer Deposition, as discussed above and shown in FIG. 7, to form the first layer of the bilayer High Q coating on the bonding surface and sidewalls of the disc resonator. Preferably, the deposited $Al_2O_3$ amorphous film is 1 to 2 nm-thick. In operation 336, a noble metal film is deposited on the Al$_2$O$_3$ amorphous film, also as discussed above and shown in FIG. 7, to form the second layer of the bilayer High Q coating on the bonding surface and sidewalls of the disc resonator. Preferably, the deposited noble metal film is 1 to 20 nm-thick. Together, the ALD Al$_2$O$_3$ amorphous film and the ALD metal film form a bilayer High Q coating that is ultra-thin, highly conformal, and highly conductive, as discussed above.

Figure 4A:
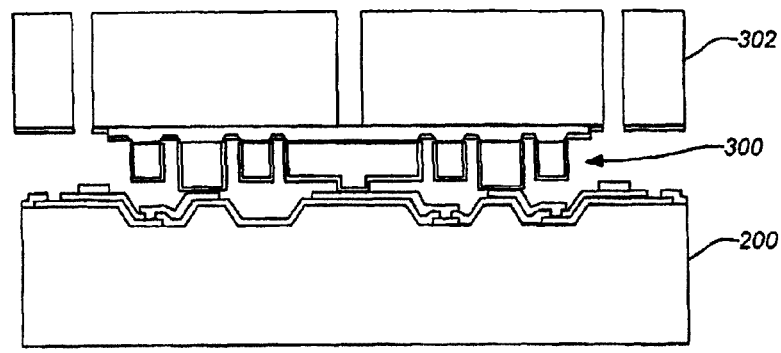
FIGS. 4A-4C illustrate an assembly process of a resonator wafer and baseplate wafer for an all-quartz resonator gyroscope in accordance with the prior art.
Figure 4B:
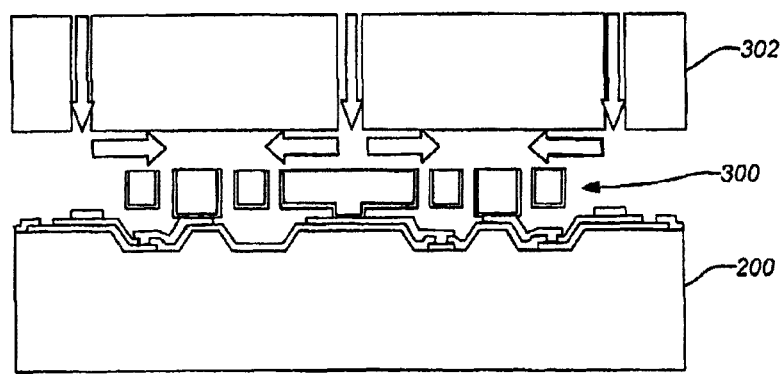
Figure 4C:
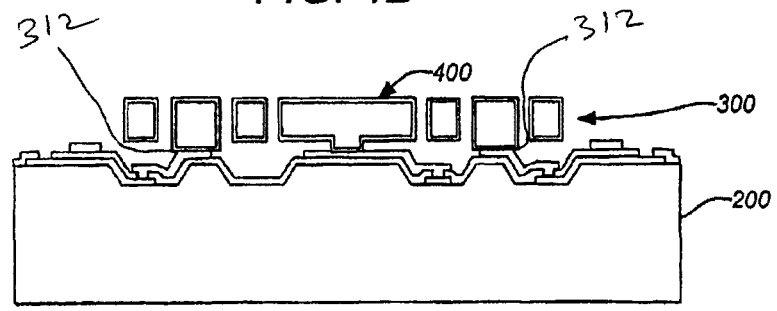

FIGS. 4A-4C illustrate assembly of a resonator wafer and baseplate wafer for an all-quartz resonator gyroscope. The resonator wafer 300 and handle wafer 302 pair are then brought in contact and aligned with the baseplate wafer 200. The resonator wafer 200 and baseplate wafer 300 may be bonded together using metal/metal thermal compression bond the metal bond pads 214 of the baseplate wafer 200 to the central support location 310 and the electrode locations 312 of the resonator wafer 300 as shown in FIG. 4A. Alignment can be performed through the transparent baseplate wafer for about 0.5 µm accuracy. These bonds form the electrical connections to the electrodes and resonator structure. To release the resonator structure from the handle wafer, Xenon difluoride gas (shown by arrows in FIG. 4B) may be passed through the release holes of the handle wafer to undercut the silicon layer to complete the transfer of the resonator wafer 300 from the handle wafer 302 to the baseplate 200. The top side of the resonator wafer may then be coated with thin metallic layer 400 (e.g., approximately 10-20 nm thick) Al or Au with angled evaporation to form a completely symmetric structure and prevent shorting of probe pads.

Figure 4D:
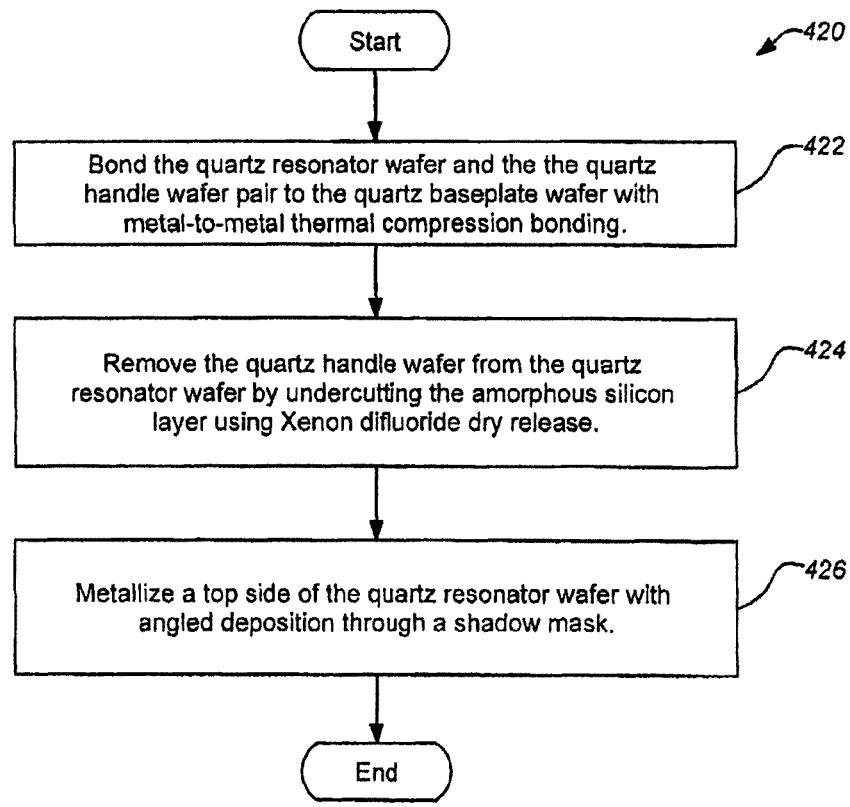
FIG. 4D is a flowchart of an exemplary method of assembling a resonator wafer and baseplate wafer for an all-quartz resonator gyroscope in accordance with the prior art.

FIG. 4D is a flowchart of a method 420 of assembling a resonator wafer and baseplate wafer for an all-quartz resonator gyroscope. In operation 422, the second and the third wafer pair are bonded to the first wafer with metal-to-metal thermal compression bonding as shown in FIG. 4A. Alignment of the second and third wafers may be performed through the transparent first wafer to achieve about 0.5 µm accuracy. In operation 424, the third wafer is removed from the second wafer by undercutting the silicon layer using Xenon difluoride dry release as shown in FIG. 4B. The flow of Xenon difluoride is indicated by the arrows. And in operation 426, the top side of the second wafer is metallized with angled deposition through a shadow mask to prevent shorting of probe pads as shown in FIG. 4C. Thus, the disc resonator is symmetrically coated with a thin conductive layer of metal to allow it to function electrostatically with the electrodes.

Figure 5A:
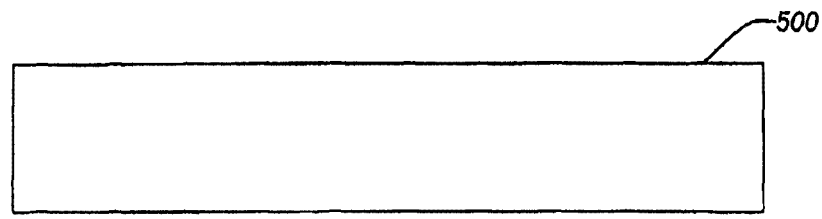
FIGS. 5A-5F illustrate a vacuum sealing process of a resonator wafer and baseplate wafer for an all-quartz resonator gyroscope in accordance with the prior art.
Figure 5B:
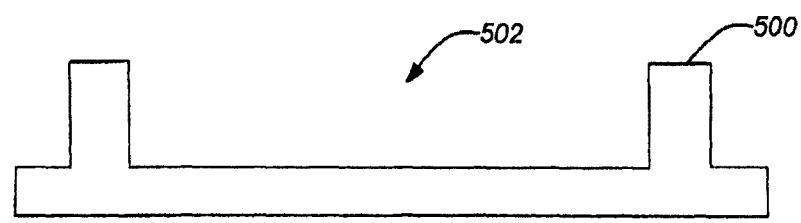
Figure 5C:
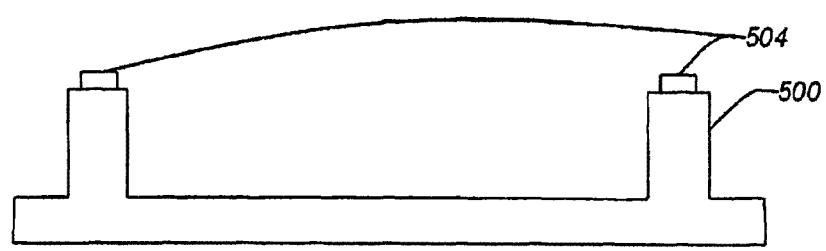
Figure 5D:
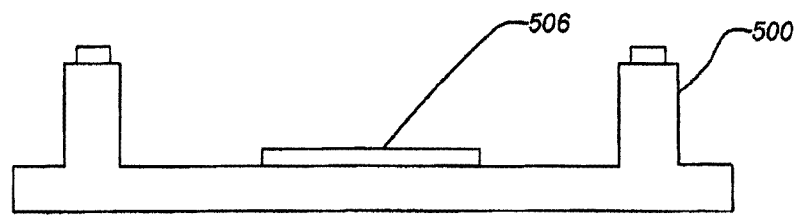
Figure 5E:
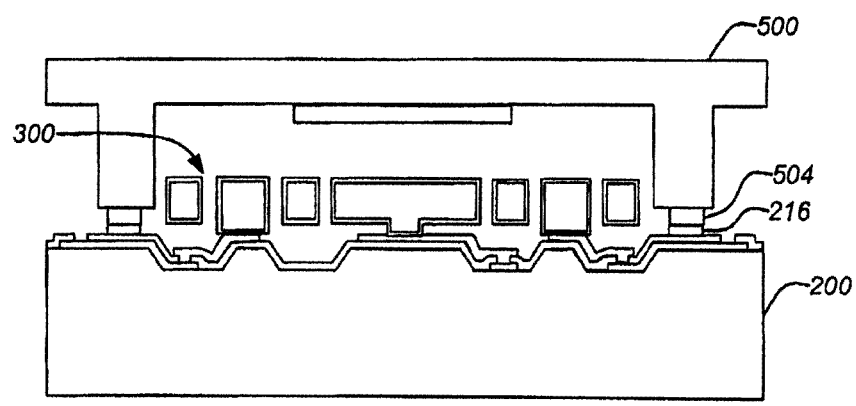
Figure 5F:
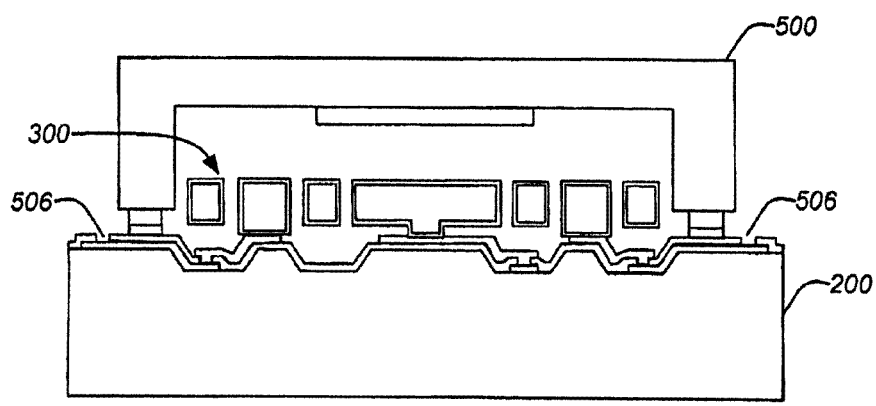

FIGS. 5A-5F illustrate a vacuum sealing process of a resonator wafer 300 and baseplate wafer 200 for an all-quartz resonator gyroscope. The vacuum sealing process begins with a cavity 502 etched into a fused quartz cap wafer 500, e.g. using ultrasonic machining as shown in FIG. 5B. Then indium or tin solder (~5 um thick) may be deposited using spray coating, lithography and lift-off to form a metal bond line 504 around the perimeter of the cavity 502 as shown in FIG. 5C. A vacuum getter 506 may then be deposited into the cavity using a shadow mask as shown in FIG. 5D. For example the vacuum getter may comprise a titanium-based thin film getter or any similar getter material compatible with the structure and processes defined herein. The cap wafer 500 is brought to the resonator wafer 300 and baseplate wafer 200 pair and aligned using a bond aligner known in the art. For example, a bond aligner system from Electronic Vision Group or other similar systems may be applied to properly bond the wafers properly aligned to one another. The cap wafer 500 may be temporarily kept in near separation from the resonator wafer 300 and baseplate wafer 200 pair with 50 µm-thick spacers. This three-wafer stack is then transferred to a wafer bonder so that the cavity of the cap wafer 500 can be evacuated through the gap created by the 50 µm-thick spacers. Once vacuum is achieved inside the cavity, the vacuum getter may be heated to approximately 350° C. for activation. The 50 µm-thick spacers may then be removed to contact the metal bond line 504 of the cap wafer 500 to the vacuum seal ring 216 of the baseplate wafer 200 to form the vacuum seal with the solder as shown in FIG. 5E. Note that the electrical interconnects to the resonator and electrodes pass under the vacuum seal. Finally, the cap wafer 500 may be ultrasonically machined to create access to the probe pads to the electrical interconnects of the gyroscope as shown in FIG. 5F.

Figure 5G:
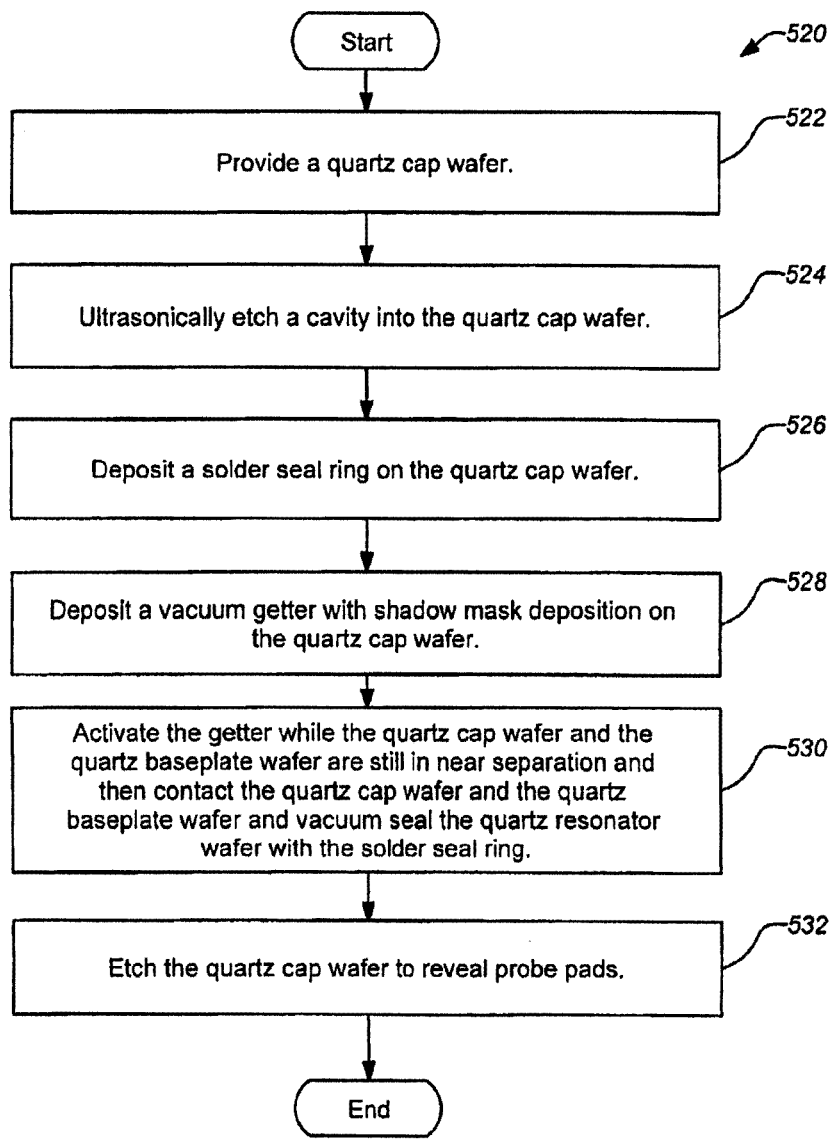
FIG. 5G is a flowchart of an exemplary method of vacuum sealing a resonator wafer and baseplate wafer for an all-quartz resonator gyroscope in accordance with the prior art.

FIG. 5G is a flowchart of a vacuum sealing method 520 of a resonator wafer and baseplate wafer for an all-quartz resonator gyroscope. In operation 522, a fourth fused quartz wafer is provided for a cap wafer as shown in FIG. 5A. In operation 524, a cavity is ultrasonically etched into the cap wafer as shown in FIG. 5B. In operation 526, a solder seal ring is deposited with spray coating lithography and lifted-off as shown in FIG. 5C. In operation 528, a vacuum getter is deposited with shadow mask deposition as shown in FIG. 5D. In operation 530, the getter is activated while the cap wafer and the baseplate wafer are still separated and then the cap wafer and the baseplate wafer are contacted to vacuum seal the resonator wafer with the solder seal ring as shown in FIG. 5E. And in operation 532, the cap wafer is then etched to reveal probe pads as shown in FIG. 5F.

Figure 6A:
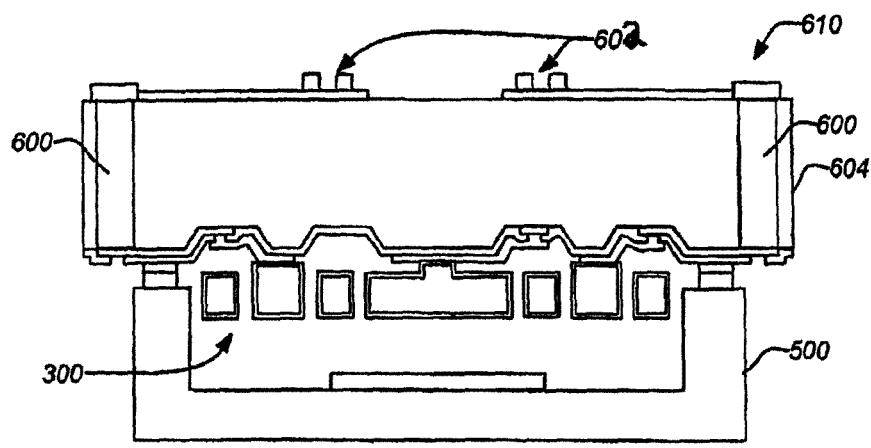
FIGS. 6A and 6B illustrate an embodiment of an all-quartz resonator gyroscope including integral control electronics in accordance with the prior art.
Figure 6B:
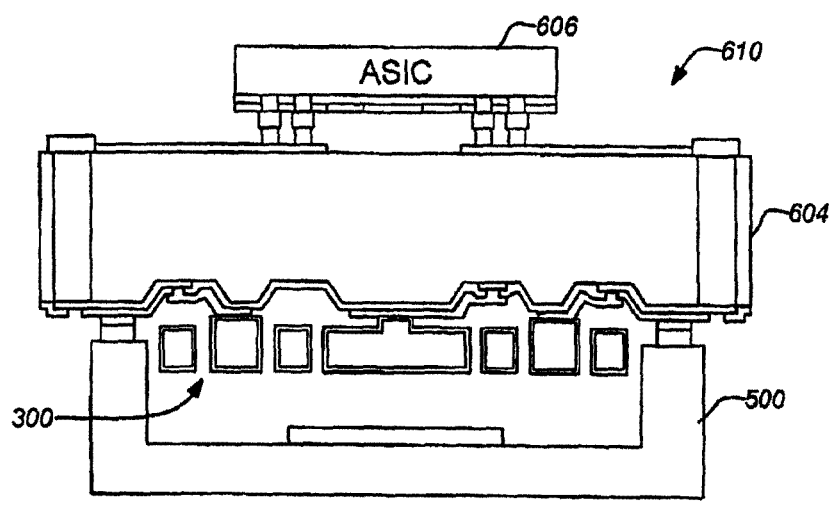

FIGS. 6A and 6B illustrate an embodiment of an all-quartz resonator gyroscope 610 including integral control electronics. In general, the gyroscope 610 is developed as described above with some additional processing. In FIG. 6A the all-quartz disc resonator gyroscope is vacuum sealed (consistent with the process outlined in FIGS. 5A-5G) with through wafer interconnects 600 and backside indium bond pads 602 integrated into the baseplate wafer 604. The baseplate wafer 604 may be produced just as the baseplate wafer 200 of FIGS. 2A-2G with the addition of the through wafer interconnects 600 being integrated into the baseplate wafer 604 prior to the metallization patterning on the wafer to form the interconnects for the electrodes as shown in FIG. 2C. In this case, the metallization is connected to the through wafer interconnects 600. Further metallization may be patterned on the backside of the baseplate wafer 604 from the through wafer interconnects 600 to the bond pads 602. In FIG. 6B control electronics 606 (e.g. an ASIC control electronics chip) may be flip-chip bonded to the all-quartz disc resonator gyroscope package with electrical connections going directly from the electronics to the electrodes and resonator within the vacuum sealed package.

As discussed above, FIGS. 4A-4C illustrate the assembly of a resonator wafer and baseplate wafer for an all-quartz resonator gyroscope in accordance with the prior art as disclosed in U.S. patent application Ser. No. 12/179,579, filed Jul. 24, 2008 and entitled "ALD METAL COATINGS FOR HIGH Q MEMS STRUCTURES." In that disclosure the drive and sense electrodes are located internally to the resonator wafer. This location for the drive and sense electrodes is also shown in FIG. 1A. However, this location of the drive and sense electrodes requires that the resonator be coated with a conductive layer along with the drive and sense electrodes. Also in order to maintain low losses, the internal location of the drive and sense electrodes requires that a thin conductive film be conformally coated within deep trenches in the resonator, which results in a degradation in the Q of the resonator. Since the bias drift of the gyro is inversely dependent on $Q^2$, decreasing the Q has the result of more drift for the gyro.

In an embodiment according to the present disclosure, the resonator with a plurality of circumferential slots is kept the same, but the sense and drive electrodes are moved outside the perimeter of the resonator. These outer sense and drive electrodes along with the outer side of the outer resonator ring and top-side of the resonators are then coated with the ALD film while a resist film allows the rest of the metal to be removed from the resonator. This prevents the Q of the resonator from being degraded significantly due to a blanket metal coating while still providing for electrical actuation and sensing via the drive and sense electrodes and the outer ring of the resonator.

In addition to the Q increase, by removing the integrated sense and drive electrodes from the interior of the resonator and moving them to be outside the perimeter of the resonator, the aspect ratio of the etch required to fabricate the gyro is reduced. This decreases the probability that micromasking from a metal mask during the quartz etch can create shorting and/or mechanical bridges between the device structures, thus increasing yield.

FIG. 12C shows the cross-section of a quartz DRG 984 in accordance with the present disclosure. The quartz resonator 950 (see FIG. 11A) in the DRG 984 includes a resonator central pillar 956 surrounded by the resonator structure 958, which consists of a plurality of circumferential slots 957, and sits upon a base wafer 900 composed of quartz and overlaid with circuitry 910, 912 and 914. The resonator central pillar 956 is bonded to the base wafer 900 at raised portion 908. The resonator structure 958 is mechanically free to allow it to resonate. The electrodes 952 and 954 for driving the DRG and sensing the Coriolis forces of the DRG are situated outside but near the perimeter of the quartz resonator 950. The exterior ring of the quartz resonator 950, which in FIG. 12C includes resonator central pillar 956 surrounded by the resonator structure 958, has a thin conductive ALD film 959. The sensing and driving electrodes 952 and 954 also have thin conductive ALD film 951 and 953, respectively, on the surfaces of the electrodes facing the quartz resonator 950 for sensing and driving the quartz resonator 950.

The resonator central pillar 956 and the resonator structure 958 have a thin conductive ALD film 960 on only the surface of the resonator structure 958 which is towards the base wafer 900, as shown in FIG. 12C. This selective coating of the conductive layer 960 allows the rest of the metal to be removed from the resonator. This prevents the Q of the quartz resonator from being degraded significantly due to a blanket metal coating while still providing for electrical actuation and sensing. Since the bias drift of the gyro is inversely dependent on $Q^2$, increasing the Q translates directly into less drift for the gyro.

In addition to the Q increase, by removing the integrated sense and drive electrodes from the interior of the resonator and moving them to the perimeter of the device, the aspect ratio of the etch required to fabricate the gyro is reduced. This decreases the probability that micromasking from a metal mask during the quartz etch can create shorting and/or mechanical bridges between the device structures, thus increasing yield.

The process for forming a DRG in accordance with the present disclosure will now be described with reference to FIGS. 9A to 12D.

Figure 9A:
FIGS. 9A-9C illustrate a manufacturing process of a base quartz wafer for an all-quartz resonator gyroscope in accordance with the present disclosure.
Figure 9B:
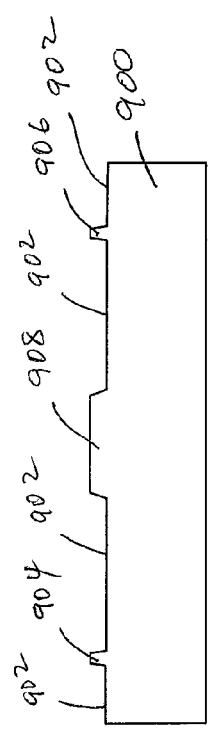
Figure 9C:
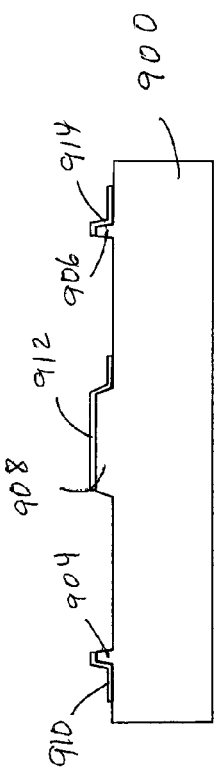

FIGS. 9A-9C illustrate a manufacturing process of a base quartz wafer for an all-quartz resonator gyroscope in accordance with the present disclosure. In FIG. 9A a base quartz wafer 900 is shown. The base quartz wafer may be fused quartz and 500 μm thick. FIG. 9B shows recesses 902 etched in the base quartz wafer using dry or wet etch. The depth of the etch to create the recesses 902 may be about 3-4 μm. This etching forms raised areas 904, 906, and 908. FIG. 9C shows interconnect and bond metal 910, 912, 914, which may be 0.5 μm gold (Au) deposited on the base quartz wafer 900.

Figure 9D:
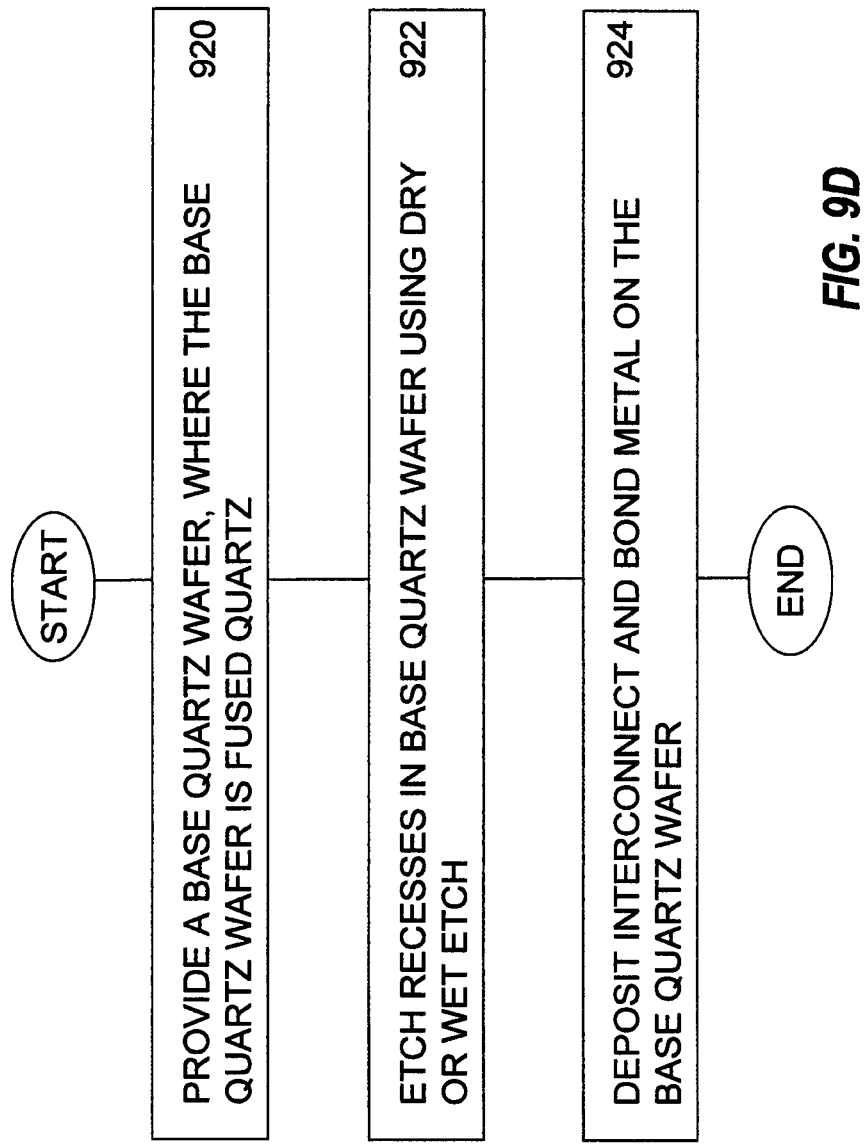
FIG. 9D is a flowchart of an exemplary method of manufacturing a base quartz wafer for an all-quartz resonator gyroscope in accordance with the present disclosure.

FIG. 9D is a flowchart of an exemplary method of manufacturing a base quartz wafer for an all-quartz resonator gyroscope in accordance with the present disclosure. In step 920 a base quartz wafer 900 is provided, which is preferrably fused quartz. In step 922 recesses 902 are etched in the base quartz wafer using dry or wet etch. Then in step 924 interconnect and bond metal 910, 912, 914 is deposited on the base quart wafer 900.

Figure 10A:
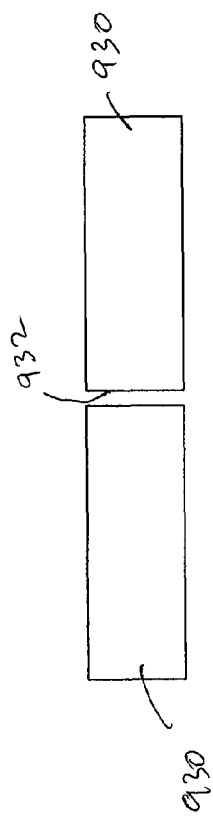
FIGS. 10A-10E illustrate a manufacturing process for a resonator quartz wafer bonded to a handle quart wafer for an all-quartz resonator gyroscope in accordance with the present disclosure.
Figure 10B:
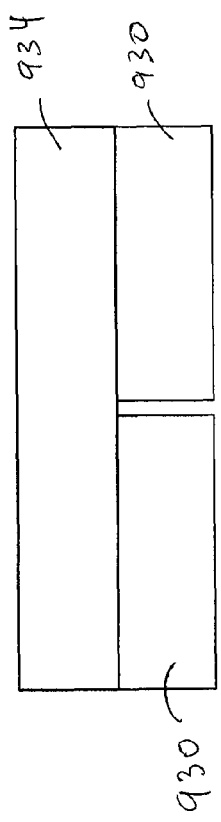
Figure 10C:
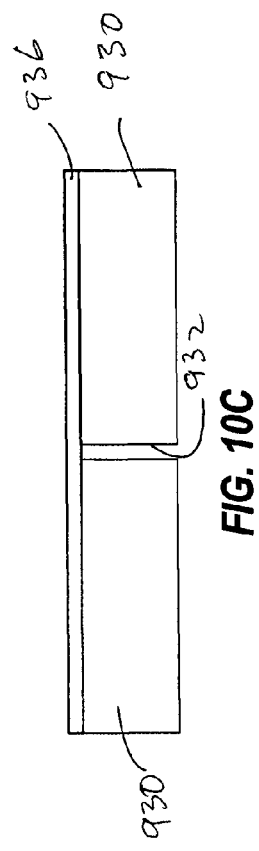
Figure 10D:
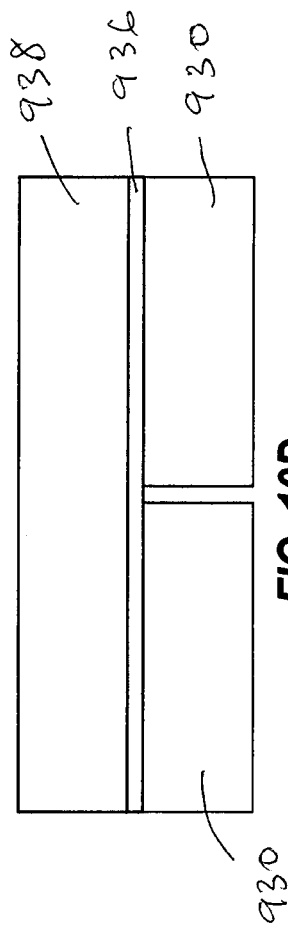
Figure 10E:
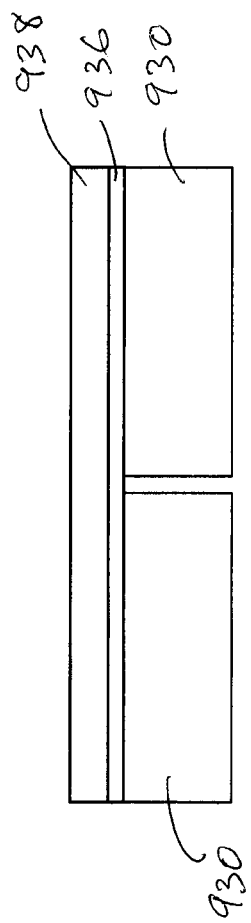

FIGS. 10A-10E illustrate a manufacturing process for a resonator quartz wafer bonded to a handle quart wafer for an all-quartz resonator gyroscope in accordance with the present disclosure. In FIG. 10A a handle quartz wafer 930 is provided with a through wafer release hole 932. The handle quartz wafer 930 may be fused quartz and be about 500 μm thick. The release hole 932 may be formed using a laser or be ultrasonically etched. FIG. 10B shows a silicon wafer 934 bonded to the handle quartz wafer 930. The silicon wafer may be about 300 μM thick. The bonding can be performed with fusion bonding or annealing at about 120 degrees centigrade for several hours. Then grinding and chemical mechanical planarization (CMP) polishing of the silicon wafer 934 is performed to form a silicon release layer 936, which may be about 10 μm thick, as shown in FIG. 10C. FIG. 10D shows a resonator quartz wafer 938 bonded onto the silicon release layer 936 with fusion bonding. The resonator quartz wafer 938 may be fused quartz and about 500 μm thick. Then grinding and chemical mechanical planarization (CMP) polishing of the resonator quartz wafer 938 is performed to form a thinned resonator quartz wafer 938, which may be about 125 thick, as shown in FIG. 10E.

Figure 10F:
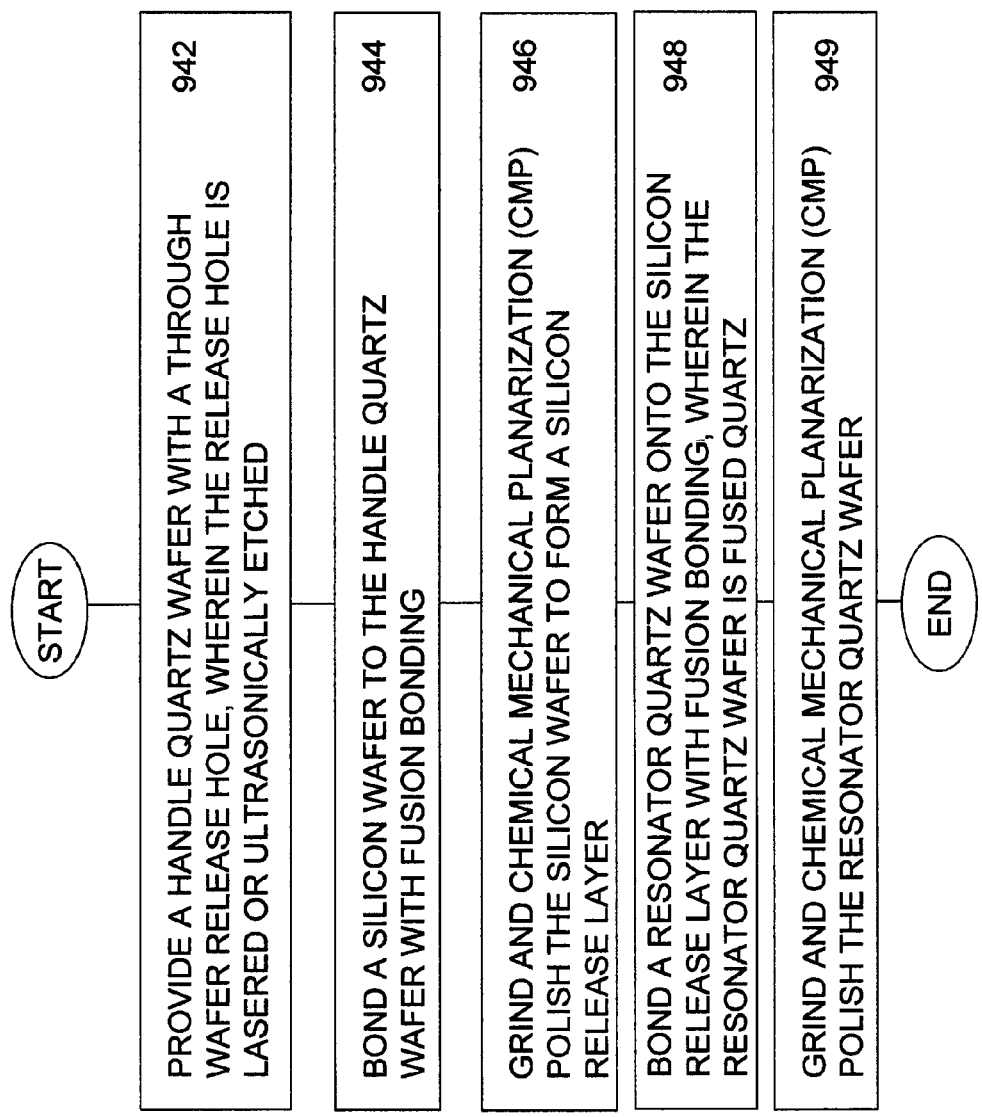
FIG. 10F is a flowchart of an exemplary method for manufacturing a resonator quartz wafer bonded to a handle quart wafer for an all-quartz resonator gyroscope in accordance with the present disclosure.

FIG. 10F is a flowchart of an exemplary method of manufacturing a resonator quartz wafer bonded to a handle quart wafer for an all-quartz resonator gyroscope in accordance with the present disclosure. In step 942 a handle quartz wafer 930 is provided with a through wafer release hole 932. Then in step 944 a silicon wafer 934 bonded to the handle quartz wafer 930 with fusion bonding or annealing at about 120 degrees centigrade for several hours. Then in step 946 grinding and chemical mechanical planarization (CMP) polishing of the silicon wafer 934 is performed to form a silicon release layer 936, which may be about 10 μm thick. Next in step 948 a resonator quartz wafer 938 is bonded onto the silicon release layer 936 with fusion bonding. Then in step 949 grinding and chemical mechanical planarization (CMP) polishing of the resonator quartz wafer 938 is performed to form a thinned resonator quartz wafer 938.

FIGS. 11A-11E illustrate a manufacturing process for a resonator for an all-quartz resonator gyroscope in accordance with the present disclosure. FIG. 11A shows the thinned resonator quartz wafer 938 after performing deep reactive ion etching (DRIE) to define a quartz resonator 950 which, as shown, includes the resonator central pillar 956 and the resonator structure 958 with a plurality of circumferential slots 957. The DRIE process also forms the external electrodes 952 and 954 simultaneously. The DRIE process uses a nickel plated mask and Ulvac etch after which the nickel is stripped away. The gap between the external electrodes 952, 954 and the outermost sidewall of the quartz resonator 950 may be less than 50 microns.

FIG. 11B shows the metallization with atomic layer deposition (ALD) 960 metal layer onto all surfaces and sidewalls of the resonator central pillar 956, the resonator structure 958, and the external electrodes 952 and 954. The ALD 960 metal layer may be platinum (Pt) or other noble metals such as Ru, Rh, Pd, Re, Ir and may be about 10 nm to 100 nm thick. An adhesion layer such as ALD $Al_2O_3$ may be deposited before the Pt in order to increase the Q and increase the adhesion of the metal to the quartz resonator 958. FIG. 11C shows bond metal 962 evaporated onto the top surfaces of the resonator central pillar 956, the resonator structure 958, and the external electrodes 952, 954. The bond metal 962 may be 0.5 µm thick gold (Au). FIG. 11D shows the result of selectively etching the bond metal 962 leaving only bond metal 966 and 964 on the bonding surfaces of the resonator central pillar 956 and external electrodes 952, 954, respectively. FIG. 11E shows the result of selectively etching the ALD 960 metal layer leaving ALD metal only on the outermost sidewall of the quartz resonator 950, the inner wall of each external electrode 952, 954, and the top surface of the resonator structure 958, which provides electrical continuity to the resonator central pillar 956. The selective etching of the ALD 960 metal layer may use a conformal mask using spray lithography followed by dry plasma etching.

Figure 11F:
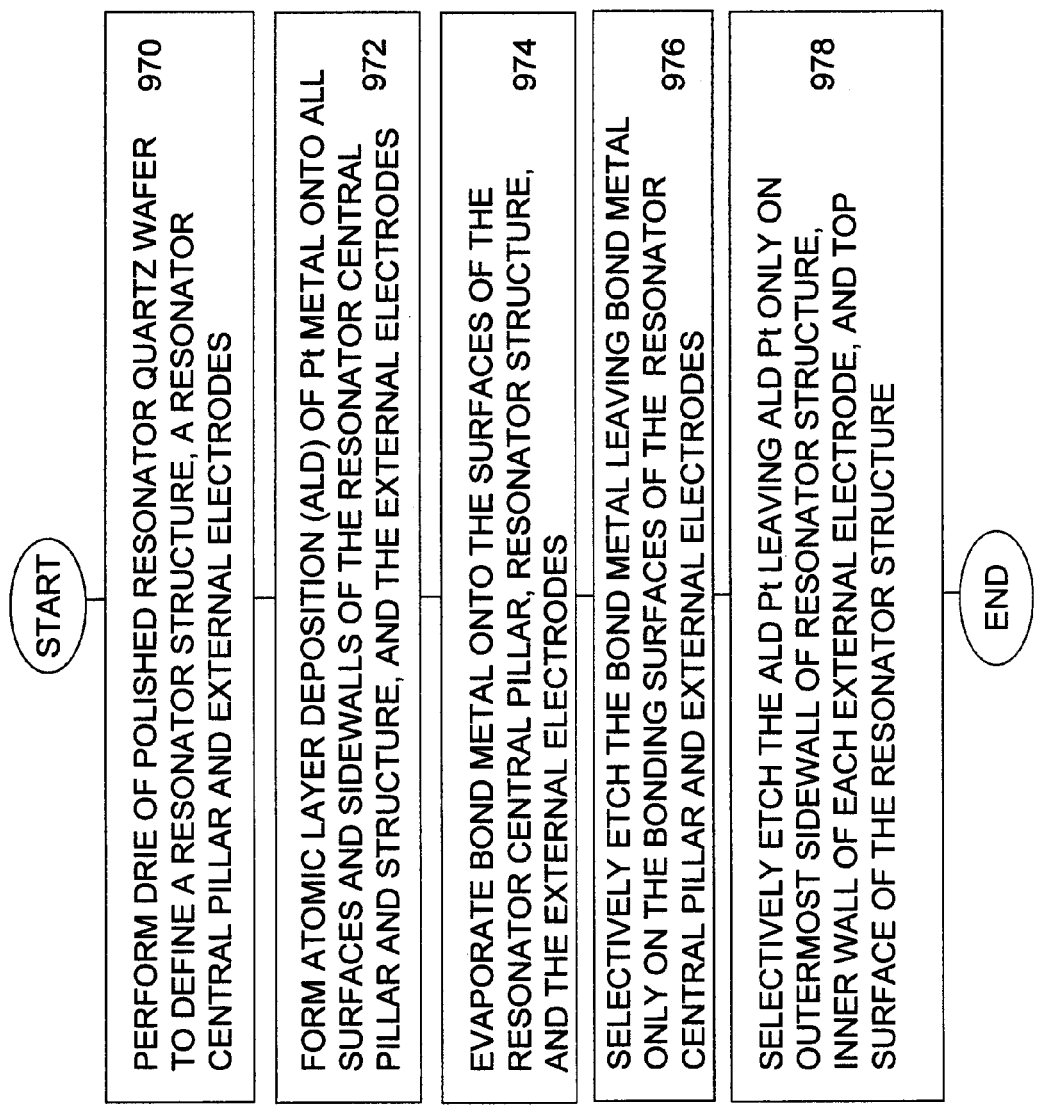
FIG. 11F is a flowchart of an exemplary method of manufacturing a resonator for an all-quartz resonator gyroscope in accordance with the present disclosure.

FIG. 11F is a flowchart of an exemplary method of manufacturing a resonator for an all-quartz resonator gyroscope in accordance with the present disclosure. In step 970 deep reactive ion etching (DRIE) is performed to define a quartz resonator 950 which, as shown, includes the resonator structure 958 and the resonator central pillar 956, and simultaneously the external electrodes 952 and 954. Then in step 972 atomic layer deposition (ALD) 960 is formed onto all surfaces and sidewalls of the resonator central pillar 956, the resonator structure 958, and the external electrodes 952 and 954. Next in step 974 bond metal 962 is evaporated onto the top surfaces of the resonator central pillar 956, the resonator structure 958, and the external electrodes 952, 954. Then in step 976 selective etching of the bond metal 962 is performed to leave only bond metal 966 and 964 on the bonding surfaces of the resonator central pillar 956 and external electrodes 952, 954, respectively. Then in step 978 selectively etching of the ALD 960 is performed to leave ALD only on the outermost sidewall of the quartz resonator 950, the inner wall of each external electrode, and top surface of the resonator structure 958.

FIGS. 12A-12C illustrate a manufacturing process for completing the fabrication of an all-quartz resonator gyroscope in accordance with the present disclosure. FIG. 12A shows the bonding of the bonding surfaces of the resonator central pillar 956 and external electrodes 952 and 954 to the interconnect and bond metal 912, and 910, 914, respectively, on the base quartz wafer 900. The bonding may be performed using metal to metal thermal compression at about 300 degrees centigrade. FIG. 12B illustrates removing the handle quartz wafer 930 from the resonator by undercutting the silicon release layer 936 by introducing a dry release agent 980 into release hole 932. The release can be performed using a $XeF_2$ dry release process. The fully released quartz gyroscope 984 is shown in FIG. 12C. By well known methods the quartz gyroscope 984 may be vacuum sealed. FIGS. 5A-5G illustrate a vacuum seal for another embodiment of a DRG and the vacuum sealing used there for that embodiment may be adapted to this embodiment. For example, the DRG may be vacuum sealed with a quartz capping wafer.

Figure 12D:
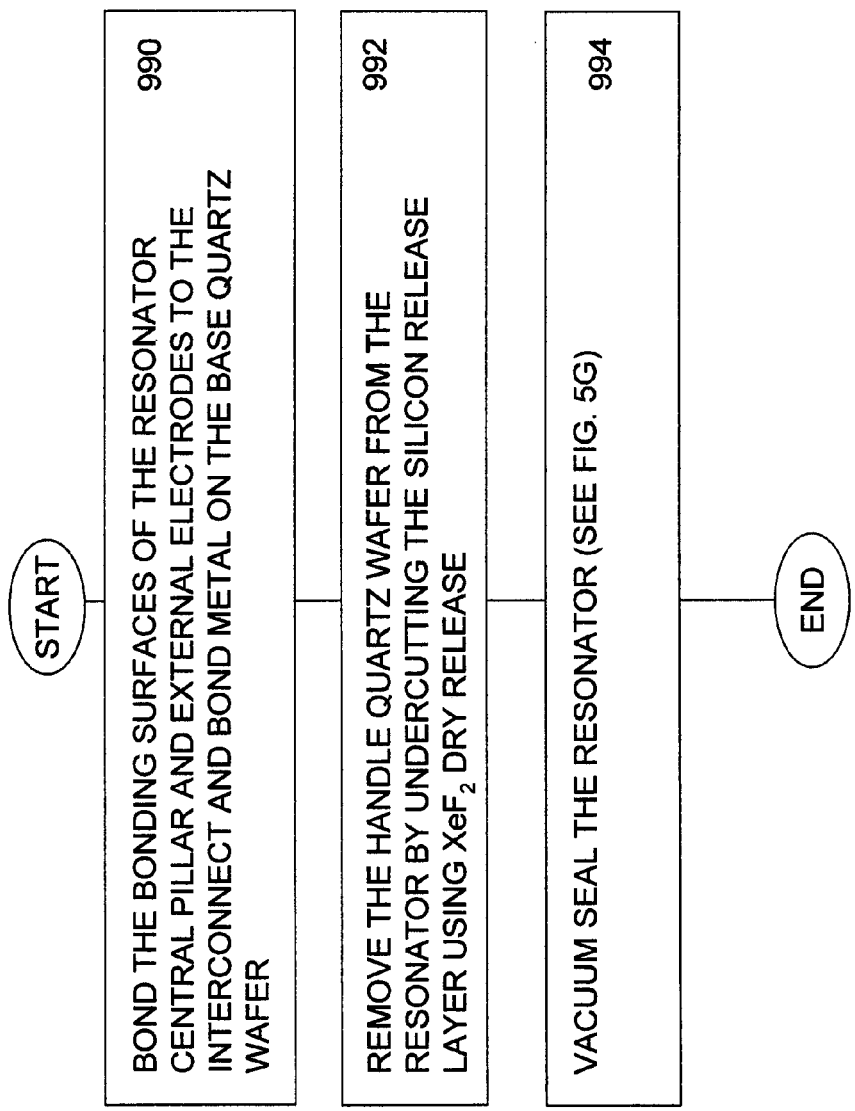
FIG. 12D is a flowchart of an exemplary method for completing the fabrication of an all-quartz resonator gyroscope in accordance with the present disclosure.

FIG. 12D is a flowchart of an exemplary method for completing the fabrication of an all-quartz resonator gyroscope in accordance with the present disclosure. In step 990 the bonding surfaces of the resonator central pillar 956 and external electrodes 952 and 954 are bonded to the interconnect and bond metal 912, and 910, 914, respectively, on the base quartz wafer 900. The bonding may be performed using metal to metal thermal compression at about 300 degrees centigrade. In step 992 the handle quartz wafer 930 is removed from the resonator by undercutting the silicon release layer 936 using a $XeF_2$ dry release process. Then in step 994 the quartz gyroscope 984 may be vacuum sealed with a quartz capping wafer.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. A disk resonator gyroscope comprising:
   a quartz base;
   a quartz resonator disk having a central pillar connected to the base, the quartz resonator disk having a surface facing the base and having plurality of circumferential slots in the surface of the quartz resonator disk around the central pillar; and
   an electrode comprised of quartz and connected to the base, the electrode outside of an outer edge of the resonator disk and not connected to the outer edge of the resonator disk;
   a conductive film on the surface of the resonator disk, the outer edge of the resonator disk, the central pillar, and an inner wall of the electrode;
   wherein the inner wall of the electrode faces the outer edge of the resonator disk.

2. The disk resonator gyroscope of claim 1 wherein:
   the base comprises fused quartz;
   the resonator disk comprises fused quartz; and
   the electrode comprises fused quartz.

3. The disk resonator gyroscope of claim 1 wherein:
   a gap between the electrode and the outer edge of the resonator disk is about 50 microns.

4. The disk resonator gyroscope of claim 1 wherein the electrode further comprises a drive electrode comprised of quartz and connected to the base outside of the outer edge of the resonator disk.

5. The disk resonator gyroscope of claim 1 wherein the electrode further comprises a sense electrode comprised of quartz and connected to the base outside of the outer edge of the resonator disk.

6. The disk resonator gyroscope of claim 1 wherein:
the base has about a 500 μm thickness; and
the resonator disk has about a 125 μm thickness.

7. The disk resonator gyroscope of claim 1 wherein the base further comprises:
a first raised area and metal deposited on the first raised area for connecting to the central pillar; and
a second raised area and metal deposited on the second raised area for electrical connection and bonding to the electrode;
wherein the first raised area has a height of about 3-4 μm; and
wherein the second raised area has a height of about 3-4 μm.

8. The disk resonator gyroscope of claim 1 further comprising:
a conductive film on a surface of the electrode;
wherein the surface of the electrode faces the base.

9. The disk resonator gyroscope of claim 1 wherein the conductive film is an Atomic Layer Deposition metal.

10. The disk resonator gyroscope of claim 1 wherein the conductive film is less than 100 nanometers thick.

11. The disk resonator gyroscope of claim 1 wherein the conductive film comprises one of Pt, Ru, Rh, Pd, Re, or Ir.

12. The disk resonator gyroscope of claim 8 further comprising an adhesion ALD layer between the conductive film and the surface of the resonator disk, the outer edge of the resonator disk, the central pillar, and the surface and the inner wall of the electrode.

13. The disk resonator gyroscope of claim 12 wherein the adhesion ALD layer comprises $Al_2O_3$.

14. The disk resonator gyroscope of claim 8 further comprising:
a conductive coating over the conductive film on the central pillar and on the surface of the electrode for interconnect and bonding to the base.

15. The disk resonator gyroscope of claim 14 wherein the conductive coating is gold and is about 0.5 μm thick.

16. A disk resonator gyroscope comprising:
a quartz base;
a quartz resonator disk having a central pillar connected to the base, the quartz resonator disk having a surface facing the base and having plurality of circumferential slots in the surface of the quartz resonator disk around the central pillar;
an electrode comprised of quartz and connected to the base, the electrode outside of an outer edge of the resonator disk and not connected to the outer edge of the resonator disk;
a conductive film on the surface of the resonator disk, the outer edge of the resonator disk, the central pillar, and a surface and an inner wall of the electrode;
wherein the inner wall of the electrode faces the outer edge of the resonator disk;
wherein the surface of the electrode faces the base; and
wherein a gap between the electrode and the outer edge of the resonator disk is less than or equal to 50 microns.

17. The disk resonator gyroscope of claim 16 wherein:
the base comprises fused quartz;
the resonator disk comprises fused quartz; and
the electrode comprises fused quartz.

18. The disk resonator gyroscope of claim 16 wherein the electrode further comprises a drive electrode comprised of quartz and connected to the base outside of the outer edge of the resonator disk.

19. The disk resonator gyroscope of claim 16 wherein the electrode further comprises a sense electrode comprised of quartz and connected to the base outside of the outer edge of the resonator disk.

20. The disk resonator gyroscope of claim 16 wherein:
the base has about a 500 μm thickness; and
the resonator disk has about a 125 μm thickness.

21. The disk resonator gyroscope of claim 16 wherein the base further comprises:
a first raised area and metal deposited on the first raised area for connecting to the central pillar; and
a second raised area and metal deposited on the second raised area for electrical connection and bonding to the electrode;
wherein the first raised area has a height of about 3-4 μm; and
wherein the second raised area has a height of about 3-4 μm.

22. The disk resonator gyroscope of claim 16 wherein the conductive film is an Atomic Layer Deposition metal.

23. The disk resonator gyroscope of claim 16 wherein the conductive film is less than 100 nanometers thick.

24. The disk resonator gyroscope of claim 16 wherein the conductive film comprises one of Pt, Ru, Rh, Pd, Re, or Ir.

25. The disk resonator gyroscope of claim 16 further comprising an adhesion ALD layer between the conductive film and the surface of the resonator disk, the outer edge of the resonator disk, the central pillar, and the surface and the inner wall of the electrode.

26. The disk resonator gyroscope of claim 25 wherein the adhesion ALD layer comprises $Al_2O_3$.

27. The disk resonator gyroscope of claim 16 further comprising:
a conductive coating over the conductive film on the central pillar and on the surface of the electrode for interconnect and bonding to the base.

28. The disk resonator gyroscope of claim 27 wherein the conductive coating is gold and is about 0.5 μm thick.

* * * * *